United States Patent
Chyan et al.

(10) Patent No.: US 7,694,261 B1
(45) Date of Patent: Apr. 6, 2010

(54) METHOD AND MECHANISM FOR IMPLEMENTING TESSELLATION-BASED ROUTING

(75) Inventors: David Dah-Juh Chyan, Saratoga, CA (US); Satish Samuel Raj, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 10 days.

(21) Appl. No.: 11/751,613

(22) Filed: May 21, 2007

Related U.S. Application Data

(62) Division of application No. 10/342,637, filed on Jan. 14, 2003, now Pat. No. 7,222,322.

(51) Int. Cl.
G06F 17/50 (2006.01)
(52) U.S. Cl. .......................................... 716/12; 716/14
(58) Field of Classification Search .................. 716/12, 716/14
See application file for complete search history.

(56) References Cited

U.S. PATENT DOCUMENTS

| | | | |
|---|---|---|---|
| 5,157,618 A | | 10/1992 | Ravindra et al. |
| 5,550,748 A | * | 8/1996 | Xiong .......................... 716/13 |
| 5,911,061 A | | 6/1999 | Tochio et al. |
| 6,175,950 B1 | * | 1/2001 | Scepanovic et al. ........... 716/13 |
| 6,230,306 B1 | | 5/2001 | Raspopovic et al. |
| 6,253,363 B1 | | 6/2001 | Gasanov et al. |
| 6,289,492 B1 | * | 9/2001 | Dutta-Choudhury et al. ... 716/5 |
| 6,289,495 B1 | | 9/2001 | Raspopovic et al. |
| 6,324,675 B1 | * | 11/2001 | Dutta et al. .................... 716/13 |
| 6,349,403 B1 | * | 2/2002 | Dutta et al. .................... 716/12 |
| 6,412,102 B1 | | 6/2002 | Andreev et al. |
| 6,625,611 B1 | | 9/2003 | Teig et al. |
| 6,668,365 B2 | | 12/2003 | Ham |
| 6,701,306 B1 | | 3/2004 | Kronmiller et al. |
| 6,785,874 B2 | | 8/2004 | Tsukuda |
| 6,845,495 B2 | | 1/2005 | Andreev et al. |
| 2001/0018759 A1 | * | 8/2001 | Andreev et al. ................ 716/7 |
| 2002/0059194 A1 | | 5/2002 | Choi et al. |
| 2004/0044980 A1 | | 3/2004 | Juengling |

OTHER PUBLICATIONS

Ahuja, R.K. et al., eds.• Network Flows. Theory, Algorithms, and Applications (1993) pp. 510-542. Prentice Hall, Upper Saddle River, NJ.

Al-Yamani, A. et al. HPTS: Heterogeneous Parallel Tabu Search for VLSI Placement *Proceedings of the 2002 Congress on Evolutionary Computation* (May 12-17, 2002) 1:351-355.

(Continued)

*Primary Examiner*—Jack Chiang
*Assistant Examiner*—Brandon W Bowers
(74) *Attorney, Agent, or Firm*—Vista IP Law Group, LLP.

(57) ABSTRACT

Disclosed are methods and mechanisms for implementing tessellation-based processing of an integrated circuit design. Tessellation based routing of objects on an integrated circuit layout can be performed by identifying a spacing rule for tessellating at least a portion of the integrated circuit layout, forming one or more plane figures in the tessellation having one or more edges compliant with the spacing rule, the edges of the one or more plane figures forming a contour derived from a shape of a blockage object, and identifying a routing path along at least part of the one or more edges. Packing and pushing of objects may be performed using this approach.

49 Claims, 30 Drawing Sheets

OTHER PUBLICATIONS

Anderson, R. et al. "An $O(n \log n)$ Algorithm for 1-D Tile Compaction" *ICCAD-89-International Conference on Computer-Aided Design* (Nov. 5-9, 1989) pp. 144-147.

Balasa, F. et al. "Efficient Solution Space Exploration Based on Segment Trees in Analog Placement with Symmetry Constraints" in *IEEE/ACM International Conference on Computer Aided Design* (Nov. '10-14, 2002) pp. 497-502.

Barzaghi, M. et al. "Hierarchical Management of VLSI Cells at Different Description Levels" *Proceedings of the 6th Mediterranean Electrotechnical Conference* (May 22-24, 1991) 1:327-330.

Benetis, R et al. "Nearest Neighbor and Reverse Nearest Neighbor Queries for Moving Objects" *Proceedings of the International Database Engineering and Applications Symposium (IDEAS'02)* (Jul. 17-19, 2002) pp. 44-53.

Bern, J. et al. "Some Heuristics for Generating Tree-like FBDD Types" *IEEE Transactions on Computer-Aided Design of Integrated Circuits and Systems* (Jan. 1996) 15(1):127-130.

Bhattacharya, S. and W.-T. Tsai Area Efficient Binary Tree Layout *1st Great Lakes Symposium on VLSI* (Mar. 1-2, 1991) pp. 18-24.

Blust, G. and D.P. Mehta "Corner Stitching for L-shaped Tiles" *Proceedings of the 3rd Great Lakes Symposium on VLSI, Design Automation of High Performance VLSI Systems* (Mar. 5-6, 1993) pp. 67-68.

Borah, M. et al. "An Edge-Based Heuristic for Steiner Routing" *IEEE Transactions on Computer-Aided Design of Integrated Circuits and Systems* (Dec. 1994) 13(12):1563-1568.

Brück, Rand H. Wronn "- geoADDICTION—Flexible Handling of Geometries in IC-Layout Tools" *ISCAS '88—IEEE International Symposium on Circuits and Systems* (Jun. 7-9, 1988) 1:723-726.

Cadence Design Systems, Inc. IC Shape-Based Technology Chip Assembly User Guide Product Version 11.0 (Nov. 2001).

Carlson. E.C. and R.A. Rutenbar "A Scanline Data Structure Processor for VLSI Geometry Checking" *IEEE Transactions on Computer-Aided DeSign* (Sep. 1987) 6(5):780-794.

Cheung, P. and J. Hesketh "Design Automation Tools for Tile-Based Analogue Cells" *IEE Colloquium on New Directions in VLSI Design* (Nov. 27, 1989) pp. 3/1-3/5.

Chiang, C. and C.-S. Chiang "Octilinear Steiner Tree Construction" *MWSCAS-2002—The 2002 45th Midwest Symposium on Circuits and Systems* (Aug. 4-7, 2002) 1 :603-606.

Christian, B.S. et al. "A VLSI Interval Router for High-Speed Networks" *Canadian Conference on Electrical and Computer Engineering* (May 26-29, 1996) 1:154-157.

Cong, J. et al. "Multilevel Approach to Full-Chip Gridless Routing" *ICCAD 2001—IEEE/ACM International Conference on Computer-Aided Design* (Nov. 4-8, 2001) pp. 396-403.

Curatelli, F. et al. "Efficient Management of Complex Elements in Physical IC Design" *Proceedings of the IEEE International Symposium on Circuits and Systems* (May 1-3, 1990) 1:456-459.

Das, S. and B.B. Bhattacharya "Channel Routing in Manhattan-Diagonal Model" *Proceedings of the 9th. International Conference on VLSI Design* (Jan. 3-6, 1996) pp. 43-48.

Dasgupta, P. et al. "Multiobjective Search in VLSI Design" *Proceedings of the 7th International Conference on VLSI Design* (Jan. 1994) pp. 395-400.

Dasgupta, P. et al. "Searching Networks With Unrestricted Edge Costs" *IEEE Transactions on Systems, Man and Cybernetics—Part A: Systems and Humans* (Nov. 2001) 31(6):497-507.

Dijkstra, E.W. "A Note on Two Problems in Connexion with Graphs" *Numerische Mathematik* (1959) 1:269-271.

de Dood. P. et al. "A Two-Dimensional Topological Compactor With Octagonal Geometry" *28th ACM/IEEE Automation Conference* (1991) pp. 727-731.

Doong, K.Y.-Y. et al. "Infrastructure Development and Integration of Electrical-Based Dimensional Process Window Checking" *IEEE Transactions on Semiconductor Manufacturing* (May 2004) 17(2):123-141.

Dutt, S. "New Faster Kernighan-Lin-Type Graph-Partitioning Algorithms" *ICCAD-93—1993 IEEE/ACM International Conference on Computer-Aided Design* (Nov. 7-11, 1993) pp. 370-377.

Façanha, H.S. et al. "Layout Tool for High Speed Electronic and Optical Circuits" *IEE Colloquium on Analogue IC Design: Obstacles and Opportunities* (Jun. 18, 1990) pp. 3/1-3/5.

Façanha, H.S. et al. "Data structures for physical representation of VLSI" *Software Engineering Journal* (Nov. 1990) 5(6):339-349.

Fang, J.P. and S.J. Chen "Tile-Graph-Based Power Planning" *ISCAS'03—Proceedings of the 2003 International Symposium on Circuits and Systems* (May 25-28, 2003) 5:V-501-V-504.

Faroe, O. et al. "Local Search for Final Placement in VLSI Design" *ICCAD 2001—IEEE/ACM International Conference on Computer-Aided Design* (Nov. 4-8, 2001) pp. 565-572.

Gannett, J.W. "Shortfinder: A Graphical CAD Tool for Locating Net-to-Net Shorts in VLSI Chip Layouts" *IEEE Transactions on Computer-Aided Design* (Jun. 1990) 9(6):669-674.

Grgek, M. et al. "Performance Comparison of Several Data Structures for Storing VLSI Geometry" *The IEEE Region 8 Eurocon 2003. Computer as a Tool* (Sep. 22-24, 2003) 1:156-159.

Guibas, L.J. and J. Stolfi "On Computing All North-East Nearest Neighbors in the L, Metric" *Information Processing Letters* (Nov. 8, 1983) 17:219-223.

Hettiaratchi, S. and P.Y.K. Cheung "A novel implementation of tile-based address mapping" *DATE '04- Proceedings of the Design. Automation and Test in Europe Conference and Exhibition* (Feb. 16-20, 2004) 1:306-310.

Hsiao, P.-Y. and W.-S. Feng "Using a Multiple Storage Quad Tree on a Hierarchical VLSI Compaction Scheme" *IEEE Transactions on Computer-Aided Design* (May 1990) 9(5):522-536.

Hsiao, P.-Y. et al. "Optimal tile partition for space region of integrated circuits geometry" *IEE Proceedings-E* (May, 1993) 140(3):145-153.

Hur, S.-W. and J. Lillas Relaxation and Clustering in a Local Search Framework: Application to Linear Placement *Proceedings of the 36th Design Automation Conference* (Jun. 21-25, 1999) pp. 360-366.

Hwang, F.K. "An $O(n \log n)$ Algorithm for Rectilinear Minimal Spanning Trees" *JACM* (Apr. 1979) 26(2):177-182.

Iwasaki, H. et al. "An Effective Data Structure for VLSI Layout Systems" *Proceedings of the IEEE International Symposium on Circuits and Systems* (Jun. 11-14, 1991) 5:3134-3137.

Johann, M. and R. Reis "Net by Net Routing with a New Path Search Algorithm" *Proceedings of the 13th Symposium on Integrated Circuits and Systems Design* (Sept. 18-24, 2000) pp. 144-149.

Kiyota, K. and K. Fujiyoshi "Simulated Annealing Search Through General Structure Floorplans Using Sequence-Pair"*ISCAS 2000—Proceedings of the 2000 IEEE International Symposium on Circuits and Systems*, Geneva, Switzerland (May 28-31, 2000) 3:77-80.

Koh, C.-K. and P.H. Madden "Manhattan or Non-Manhattan? A Study of Alternative VLSI Routing Architectures" *Proceedings of the 10th Great Lakes Symposium on VLSI* (Mar. 2000) pp. 47-52.

Kruskal, Jr., J.B. "On the Shortest Spanning Subtree of a Graph and the Traveling Salesman Problem" *Proc. Amer. Math. Soc.* (1956) pp. 48-50.

Ku, L.-P. and H.W. Leong "Note on optimal tile partition for space region of integrated-circuit geometry" *IEE Proceedings on Computers and Digital Techniques* (Jul. 1996) 143(4):246-248.

Kubo. Y. et al. "Self-Reforming Routing for Stochastic Search in VLSI Interconnection Layout" *Proceedings of the ASP-DAC 2000 Asia South Pacific Design Automation Conference* (Jan. 25-28, 2000) pp. 87-92.

Kuh. E.S. and T. Ohtsuki "Recent Advances in VLSI Layout" *Proceedings of the IEEE* (Feb. 1990) 78(2):237-263.

Kunii, T.L. et al. "Hierarchic Shape Description via Singularity and Multiscaling" *COMPSAC 94—Proceedings of the 18th Annual International Computer Software and Applications Conference* (Nov. 9-11, 1994) pp. 242-251.

Lai, G.G. et al. "Hinted Quad Trees for VLSI Geometry DRC Based on Efficient Searching for Neighbors" *IEEE Transactions on Computer-Aided Design of Integrated Circuits and Systems* (Mar. 1996) 15(3):317-324.

Lai, Y.-K. et al. "An Efficient Array Architecture with Data-Rings for 3-Step Hierarchical Search Block Matching Algorithm" *1997 IEEE International Symposium on Circuits and Systems*, Hong Kong (Jun. 9-12, 1997) 2:1361-1364.

Liao, S. et al. "An Efficient External-Memory Implementation of Region Query with Application to Area Routing" (ICCD'02)—Proceedings of the 2002 IEEE International Conference on Computer Design: VLSI in Computers and Processors (Sept. 16-18, 2002) pp. 36-41.

Lin, Y.-L. et al. "Routing Using a Pyramid Data Structure" ICCAD-89—1989 International Conference on Computer-Aided Design (Nov. 5-9, 1989) pp. 436-439.

Lin, Y.-L. et al. "Hybrid Routing" IEEE Transactions on Computer-Aided Design (Feb. 1990) 9(2):151-157.

Linhares, A. "Synthesizing a Predatory Search Strategy for VLSI Layouts" IEEE Transactions on Evolutionary Computation (Jul. 1999) 3(2):147-152.

Lodha, S.K. and D. Bhatia "Bipartitioning Circuits using TABU Search" Proceedings of the 11th Annual IEEE International ASIC Conference (Sep. 13-16, 1998) pp. 223-227.

Luk, W.K. and A.A. Dean "Multistack Optimization for Data-Path Chip Layout" IEEE Transactions on Computer-Aided Design (Jan. 1991) 10(1):116-129.

Margarino, A. et al. "A Tile-Expansion Router" IEEE Transactions on Computer-Aided Design (Jul. 1987) 6(4):507-517.

Marple, D. et al. "Tailor: A Layout System Based on Trapezoidal Corner Stitching" IEEE Transactions on Computer-Aided Design (Jan. 1990) 9(1):66-90.

Mehta, D. and G. Blust "Corner Stitching for Simple Rectilinear Shapes" IEEE Transactions on Computer-Aided Design of Integrated Circuits and Systems (Feb. 1997) 16(2): 186-198.

van der Meijs. N.P. and A.J. van Genderen "Space-Efficient Extraction Algorithms" Proceedings of the 3rd European Conference on Design Automation (Mar. 16-19, 1992) pp. 520-524.

van der Meijs. N.A. and A.J. van Genderen "An Efficient Algorithm for Analysis of Non-Orthogonal Layout" ISCAS '89—IEEE International Symposium on Circuits and Systems (May 8-11, 1989) 1:47-52.

Modarres. H. and R.J. Lomax "A Formal Approach to Design-Rule Checking" IEEE Transactions on Computer-Aided Design (Jul. 1987) 6(4):561-573.

Nakatake. S. et al. "Consistent Floorplanning with Hierarchical Superconstraints" IEEE Transactions on Computer-Aided Design of Integrated Circuits and Systems (Jan. 2002) 21 (1 ):42-49.

Öten. R. and R. J.P. de Figueiredo "Topological Dimensionality Determination and Dimensionality Reduction Based on Minimum Spanning Trees" ISCAS '98—Proceedings of the 1998 IEEE International Symposium on Circuits and Systems (May 31-Jun. 3, 1998) 3:366-369.

Pitaksanonkul, A. et al. "Comparisons of Quad Trees and 4-D Trees: New Results" IEEE Transactions on Computer-Aided Design (Nov. 1989) 8(11):1157-1164.

Powers, K.D. et al. "The 60" Grid: Routing Channels in Width d/√3" Proceedings of the 1st Great Lakes Symposium on VLSI (Mar. 1-2, 1991) pp. 214-219.

Preparata, F.P. and M.I. Shamos, Computational Geometry An Introduction (1985) Springer-Verlag New York Inc.

Prim, R.C. "Shortest Connection Networks and Some Generalizations" The Bell System Technical Journal (Nov. 1957) 36(6):1389-1401.

Rothermel, H.-J. and D.A. Mlynski "Automatic Variable-Width Routing for VLSI" IEEE Transactions on Computer-Aided Design (Oct. 1983) 2(4):271-284.

Sait, S.M. et al. "Performance and Low Power Driven VLSI Standard Cell Placement using Tabu Search" CED '02—Proceedings of the 2002 Congress on Evolutionary Computation (May 12-17, 2002) 1:372-377.

Sakanushi, K. and Y. Kajitani "The Quarter-State Sequence (Q-sequence) to Represent the Floorplan and Applications to Layout Optimization" IEEE APCCAS 2000—The 2000 IEEE Asia-Pacific Conference on Circuits and Systems (Dec. 4-6, 2000) pp. 829-832.

Salek, A.H. et al. "Hierarchical Buffered Routing Tree Generation" IEEE Transactions on Computer-Aided Design of Integrated Circuits and Systems (May 2002) 21(5):554-567.

Sarrafzadeh, M. et al. "Single-Layer Global Routing" IEEE Transactions on Computer-Aided Design of Integrated Circuits and Systems (Jan. 1994) 13(1 ):38-47.

Schmiedle, F. et al. "Exact Routing with Search Space Reduction" IEEE Transactions on Computers (Jun. 2003) 52(6):815-825.

Sequin, C.H. and H. da Silva Façanha "Corner-Stitched Tiles with Curved Boundaries" IEEE Transactions on Computer-Aided Design of Integrated Circuits and Systems (Jan. 2003) 12(1 ):47-58.

Serdar, T. and C. Sechen "Automatic Datapath Tile Placement and Routing" Conference and Exhibition on Design, Automation and Test in Europe (Mar. 13-16, 2001) pp. 552-559.

Sim, S.-P. et al. "Analytical Capacitance Model for High-Speed Interconnects with Diagonal Routing" Proceedings of the IEEE 2002 International Interconnect Technology Conference (Jun. 3-5, 2002) pp. 157-158.

Su, S.J. and Y.S. Kuo "Multicell Quad Trees" Proceedings of the 3rd European Conference on Design Automation (Mar. 16-19, 1992) pp. 147-151.

Sun, P.K. "An Octagonal Geometry Compactor" Proceedings of the 1998 IEEE International Conference on Computer Design: VLSI in Computers and Processors—ICCD'88 (Oct. 3-5, 1988) pp. 190-193.

Suzuki, G. et al. "MOSAIC: A Tile-Based Datapath Layout Generator" ICCAD-92—1992 IEEE/ACM International Conference on Computer-Aided Design (Nov. 8-12, 1992) pp. 166-170.

Tan, X. and X. Song "Improvement on the diagonal routing model" IEEE Proceedings on Circuits, Devices and Systems (Dec. 1994) 141(6):535-536.

Tarjan, R.E., ed. Data Structures and Network Algorithms Society for Industrial and Applied Mathematics, Philadelphia, PA (1983) pp. 71-83.

Tsai, C.-C. et al. "An H-V Alternating Router" IEEE Transactions on Computer-Aided Design (Aug. 1992) 11 (8):976-991.

Tseng, H.-P. and C. Sechen "A Gridless Multi-Layer Router for Standard Cell Circuits using CTM Cells" ED&TC 97—Proceedings of the European Design and Test Conference (Mar. 17-20, 1997) pp. 319-326.

Tseng, H.-P. and C. Sechen "A Gridless Multilayer Router for Standard Cell Circuits Using CTM Cells" IEEE Transactions on Computer-Aided Design of Integrated Circuits and Systems (Oct. 1999) 18(10):1462-1479.

Tzionas, P.G. et al. "A New, Cellular Automaton-Based, Nearest Neighbor Pattern Classifier and Its VLSI Implementation" IEEE Transactions on Very Large Scale Integration (VLSI) Systems (Sep. 1994) 2(3):343-353.

Wu, G.-M. et al. "Rectilinear Block Placement Using B-Trees" Proceedings of the International Conference on Computer Design (Sep. 17, 2000) pp. 351-356.

Xing, Z. and R. Kao "Shortest Path Search Using Tiles and Piecewise Linear Cost Propagation" IEEE Transactions on Computer-Aided Design of Integrated Circuits and Systems (Feb. 2002) 21 (2):145-158.

Xu, N. et al. "TSCSP: Tabu Search Algorithm for VLSI Module Placement Based on the Clustering Sequence-Pair" 5th International Conference on ASIC (Oct. 21-24, 2003) 1:306-310.

Yamazaki, H. et al. "Optimum Packing of Convex-Polygons by a New Data Structure Sequence-Table" IEEE APCCAS 2000—The 2000 IEEE Asia-Pacific Conference on Circuits and Systems (Dec. 4-6, 2000) pp. 821-824.

Yan, Z. et al. "Area Routing Oriented Hierarchical Corner Stitching with Partial Bin" Proceedings of the ASP-DAC 2000 Asia-South Pacific Design Automation Conference (Jan. 25-28, 2000) pp. 105-110.

Yu, Z. et al. "Layout-based 3D Solid Modeling for IC" Proceedings of the 1995 International Symposium on VLSI Technology, Systems and Applications (May 31-Jun. 2, 1995) pp. 108-112.

Zhang, Y. et al. "A Gridless Router Based on Hierarchical PB Corner Stitching Structure" IEEE 2002 International Conference on Communications, Circuits and Systems and West Sino Expositions (Jun. 29-Jul. 1, 2002) 2:1438-1443.

Zheng, S.-O. et al. "Efficient Maze-Running and Line-Search Algorithms for VLSI Layout" *Proceedings of the IEEE Southeastcon '93* (Apr. 4-7, 1993) 7 p.

Zheng, S.O. et al. Finding Obstacle-Avoiding Shortest Paths Using Implicit Connection Graphs *IEEE Transactions on Computer-Aided Design of Integrated Circuits and Systems* (Jan. 1996) 15(1):103-110.

Zheng, S.O. et al. Routing Using Implicit Connection Graphs *9th International Conference on VLSI Design* (Jan. 3-6, 1996) pp. 49-52.

Johnson, Howard; "Breaking up a pair," EDN, (Nov. 9, 2000). 1 pg.

"Supermax ECAD Documentation v9.2." Copyright 1985-2003; 1 pg.; "Supermax ECAD Version 9 Featrures,; 2 pgs.; http://www.dde-eda.com/v9features.html;" chshape,; 3 pgs.; http://www-dde-eda.com/ecadman/ipi/chshape.html; "Design Properties," 10 pgs., http://dde-eda.com/ecadman/ipl/objectref/dp-mnpo.html.

Brenner, U. et al. "An Effective Congestion Driven Placement Framework" *Proceedings of the 2002 International Symposium on Physical Design*, San Diego, CA (Apr. 7-11, 2002) pp. 6-11.

Hu, J. et al. "A Survey on Multi-net Global Routing for Intergrated Circuits" (1998), pp. 1-68, located at http://www.ece.umn.edu/users/sachin/PUBS/integration01.pdf.

Sarker, P. et al. "Routability-Driven Repeater Block Planning Interconnect-Centric Floorplanning" *Proceedings of the International Symposium on Physical Design* (Apr. 2000) pp. 186-191.

\* cited by examiner

Fig. 1a
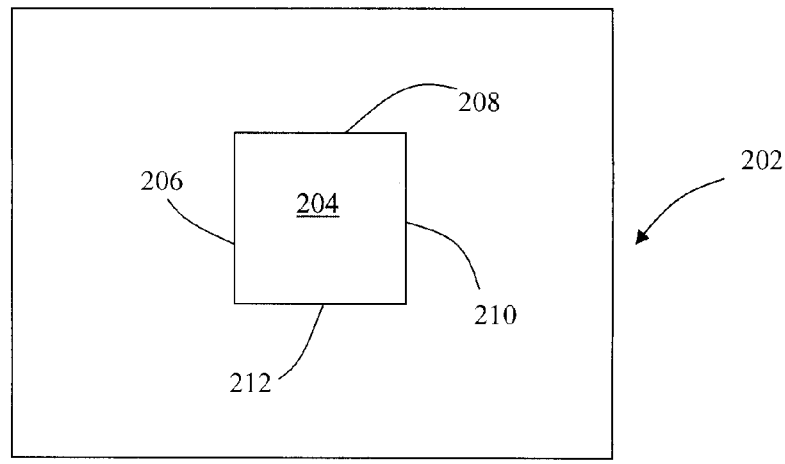
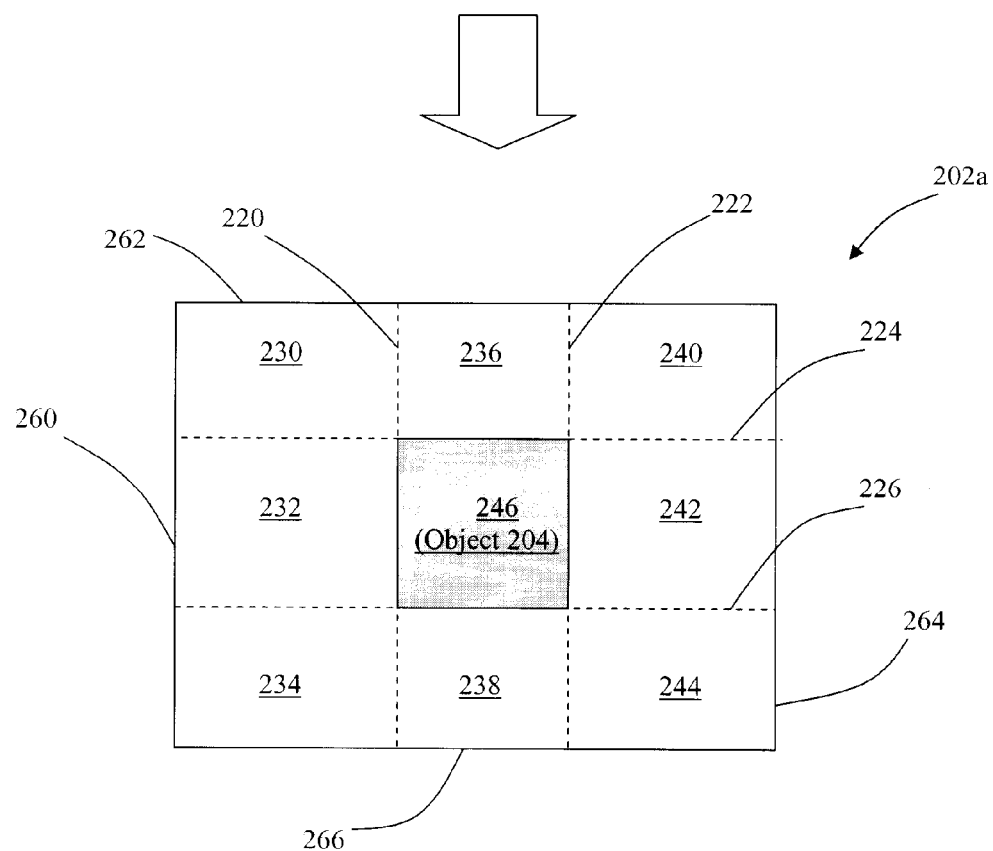

Continued on Fig. 11b

Fig. 11b
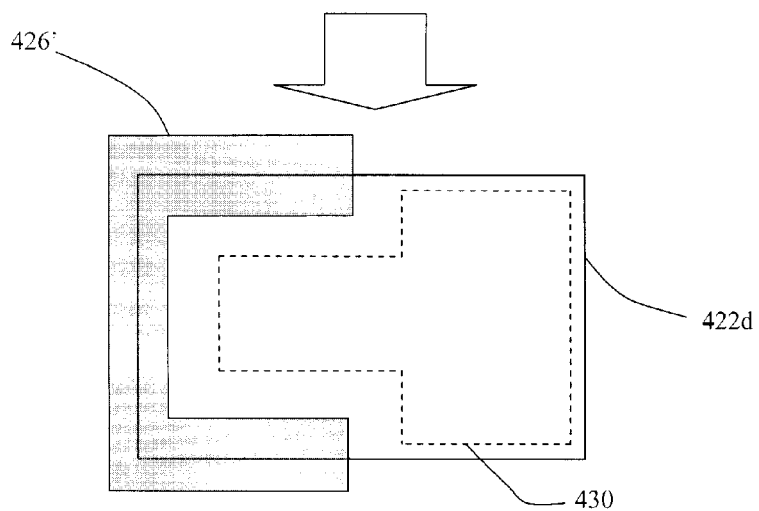
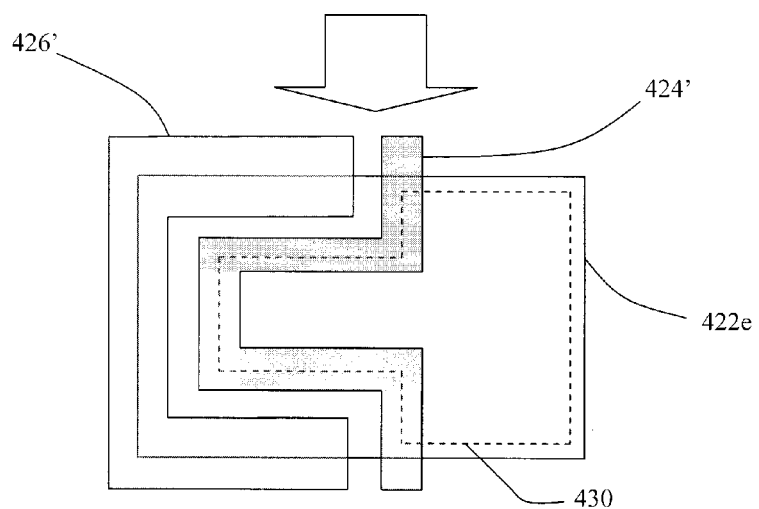

Fig. 14
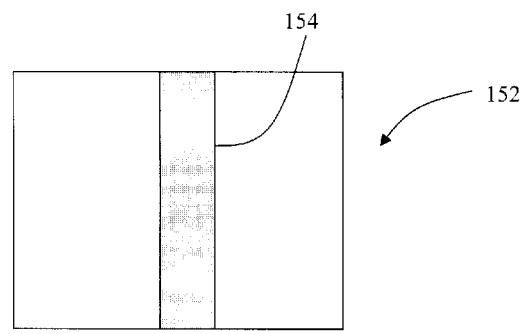
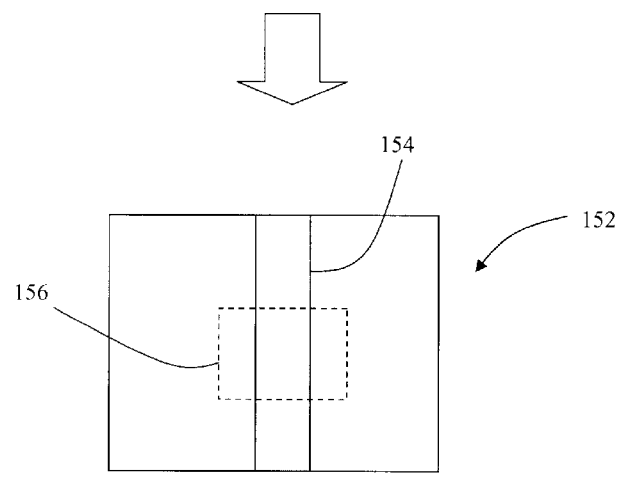

METHOD AND MECHANISM FOR IMPLEMENTING TESSELLATION-BASED ROUTING

CROSS-REFERENCE TO RELATED APPLICATIONS

The present application is a divisional of U.S. patent application Ser. No. 10/342,637, filed on Jan. 14, 2003. The present application is related to co-pending U.S. application Ser. No. 11/751,608, filed on May 21, 2007, entitled "Method and Mechanism for Implementing Tessellation-Based Routing." Both of these applications are incorporated herein by reference in their entirety.

BACKGROUND

The invention relates to a method and mechanism for designing, placing, and routing an integrated circuit ("IC").

An IC is a small electronic device typically formed from semiconductor material. Each IC contains a large number of electronic components, e.g., transistors, that are wired together to create a self-contained circuit device. The components and wiring on the IC are materialized as a set of geometric shapes that are "placed and routed" on the chip material. During placement, the location and positioning of each geometric shape corresponding to an IC component are identified on the IC layers. During routing, a set of routes are identified to tie together the geometric shapes for the electronic components.

For many designers, a goal of the IC design process is to place as many components as possible within the smallest possible area on an IC chip. A number of advantages exist by being able to place greater densities of components on the chip. For example, squeezing more components onto a chip allows smaller chips to be made, increasing the number of chips from a given production run as compared to larger chip sizes. In addition, increasing the density of components on an IC allows a greater number of the components to be placed on the chip, which facilitates an increase in chip functionality.

Consider the process to place and route a chip. A typical problem faced by the designer (or the designer's electronic design automation ("EDA") tool) is how to place shapes on the chip or route wires through the chip when there are already existing objects and wires on the chip floorplan. In many cases, the designer is able to identify the most efficient path/location to route a wire or to place a shape, but is unable to place/route in that location because that exact position on the chip is already occupied by other shapes or wires. Even if the exact location on the chip is unoccupied, design/manufacturing rules may not allow the designer to locate an object in that location. Moreover, even if sufficient space is available and can legally allow placement/routing of an object, many EDA tools cannot efficiently identify the optimal way to place/route objects in the space close to other objects to maximize density of components. The solution in many cases is to move the shape to an alternate and possibly less preferred location or to route the wire through another path, which may be an inefficient and more convoluted path.

SUMMARY

The present invention provides methods and mechanisms for implementing tessellation-based processing of an integrated circuit design. In an embodiment, tessellation based routing of objects on an integrated circuit layout is performed by identifying a spacing rule for tessellating at least a portion of the integrated circuit layout, forming one or more plane figures in the tessellation having one or more edges compliant with the spacing rule, the edges of the one or more plane figures forming a contour derived from a shape of a blockage object, and identifying a routing path along at least part of the one or more edges. Packing and pushing of objects may be performed using this approach. Other and additional objects, features, and advantages of the invention are described in the detailed description, figures, and claims.

BRIEF DESCRIPTION OF THE DRAWINGS

FIGS. 1a-d show example approaches for implementing space tiles;

FIGS. 9, 10, 11a-b, 12, and 13 show illustrated examples of a process for space tile based packing according to embodiment(s) of the invention.

FIG. 14 shows an object being placed at a location already occupied by another object.

DETAILED DESCRIPTION

Figure 1B:
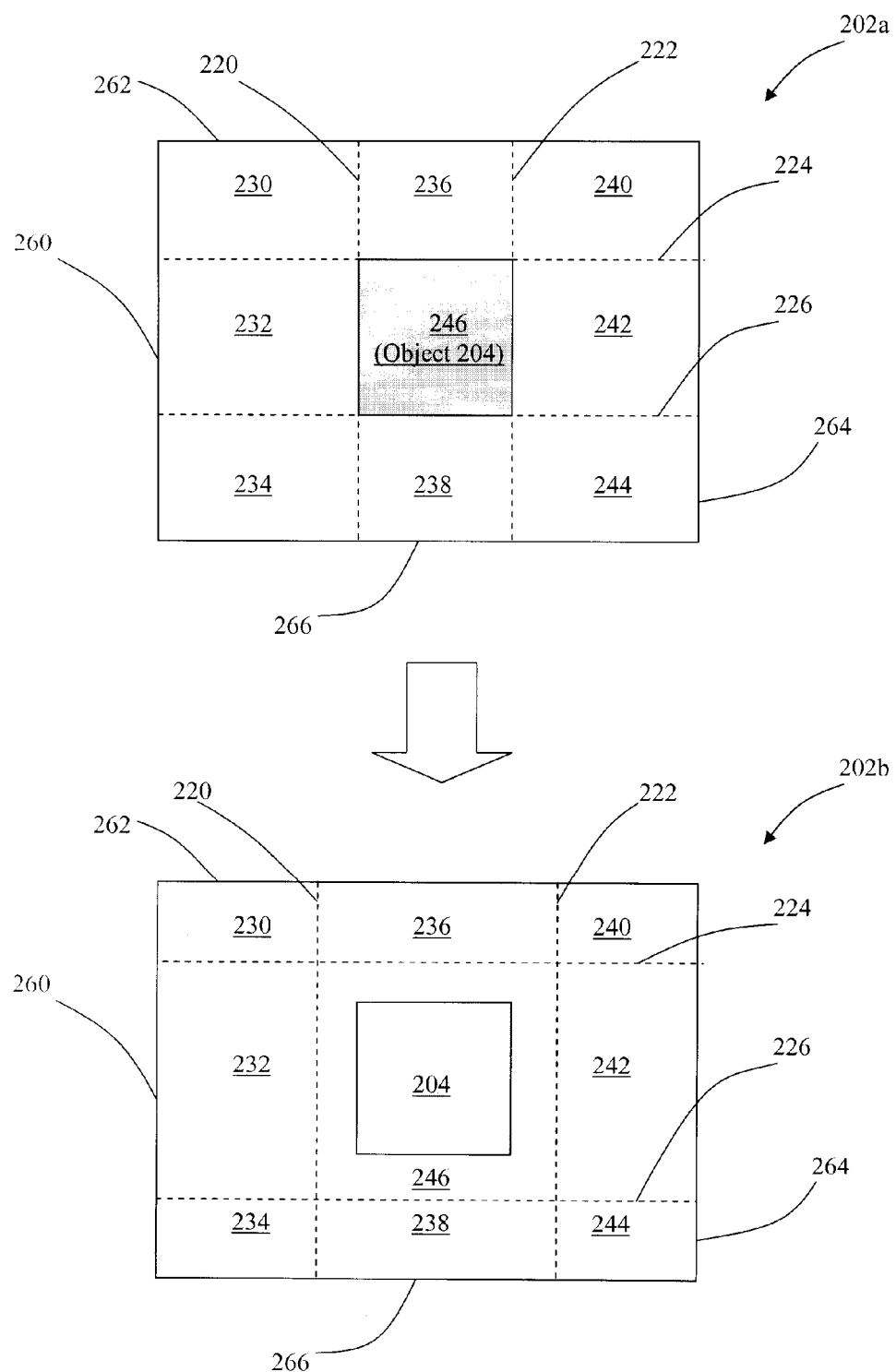

The present invention provides embodiments for a method and mechanism in which space tiles are employed to identify available locations to route wires or place objects in an integrated circuit design.

Space Tile Overview

A set of space tiles is formed by tessellating an area within an IC design. A space tile corresponds to a plane figure in the tessellation. In one embodiment, the contours of some or all of the space tiles are derived from or are based upon the shapes of existing objects in the tessellated area. "Free" space tiles refer to space tiles which are presently unoccupied. "Used" space tiles refer to space tiles that are occupied by one or more objects. An example of a product that identifies free space tiles in a design is the IC Craftsman product, available since at least 1998 from Cooper and Chyan Technology, now owned and distributed by Cadence Design Systems, Inc. of San Jose, Calif. The IC Craftsman product uses free space tiles to identify a possible location for a via and to identify a pin's ability to escape to a certain boundary.

Various approaches can be employed to form space tiles on a chip. One example approach is to identify the edges of existing objects within a window, and extending those edges (e.g., using hyper-planes) to define boundary lines within the window. These boundary lines become the borders of spaces tiles within the window. FIG. 1a illustrates this approach for forming space tiles using the boundaries of existing shapes within a chip portion. In FIG. 1a, an existing shape/object 204 is located in a window 202. Object 204 is shaped such that it includes a top edge 208, bottom edge 212, left edge 206, and right edge 210. Throughout this document, orientation-related terms such as "top", "bottom", "left", and "right" are used to provide a thorough explanation of the invention—it is noted that no intent is intended by these terms to limit the scope of the invention except as specifically stated in the claims.

As shown in revised window 202a, each of the edges 206, 208, 210, and 212 on object 204 are extended in both directions until they reach the edge/boundary of the window 202a or another object. These edge extensions form boundary lines in the window 202a. Thus, edge 206 is extended to form boundary line 220. Similarly, edge 208 is extended to form boundary line 224, edge 210 is extended to form boundary line 222, and edge 212 is extended to form boundary line 226. If window 202a contains additional shaped objects, this process repeats for each additional object in the window.

A space tile corresponds to each portion of window 202a bounded by a set of boundary lines, or bounded by boundary lines and the edge of the window 202a. Thus, space tile 230 corresponds to the portion of window 202a bounded by boundary line 220, boundary line 224, left window edge 260, and top window edge 262. Space tile 232 corresponds to the portion of window 202a bounded by boundary line 224, boundary line 220, boundary line 226, and left window edge 260. In a similar manner, space tiles 234, 236, 238, 240, 242, and 244 correspond to the various boundary lines and window edges shown for window 202a. Note that each of these space tiles 230-244 are vacant of any shapes or objects. Since these space tiles are presently empty, they are considered free space tiles eligible to receive additional objects or shapes.

Object 204 is entirely bounded by boundary lines (boundary lines 220, 222, 224, and 226). The region bounded by these boundary lines itself forms a space tile 246, which is entirely occupied by object 204. Since space tile 246 is completely filled by object 204, it is considered a used space tile that is not eligible to receive any additional objects or shapes.

The dimensions of the space tiles can be adjusted to allow compliance with design and manufacturing rules. Since one reason for identifying free space tiles is to identify regions of the chip that are available to locate additional objects, the dimensions of the space tiles may be adjusted to ensure that placing an object in the free space tile will not create a conflict, e.g. a design rule checking ("DRC") violation, with other existing objects on the layout.

Referring to FIG. 1b, shown is the window 202a containing the free space tiles 230, 232, 234, 236, 238, 240, 242, and 242 that were created surrounding object 204 and its corresponding used space tile 246 in FIG. 1a. Without taking design rules into account, each of the free space tiles 230-244 directly abut the used space tile 246, since the only consideration taken to this point to form the free space tiles has been to identify the exact exterior dimensions of the object 204.

To comply with design rules, a fence can be created around object 204 that identifies a surrounding distance in which other objects cannot be placed. Thus, boundary lines 220, 222, 224, and 226 are shifted by a given clearance distance away from the edges of object 204, as shown in window 202b. As before, the boundary lines form the boundaries of the resultant space tiles in the window 202b. Thus, it can be seen that used space tile 246 now includes a fence around object 204 that is not actually occupied, but is considered "used" to prevent other objects from being placed within that region in a way that would violate design or manufacturing rules.

Figure 1C:
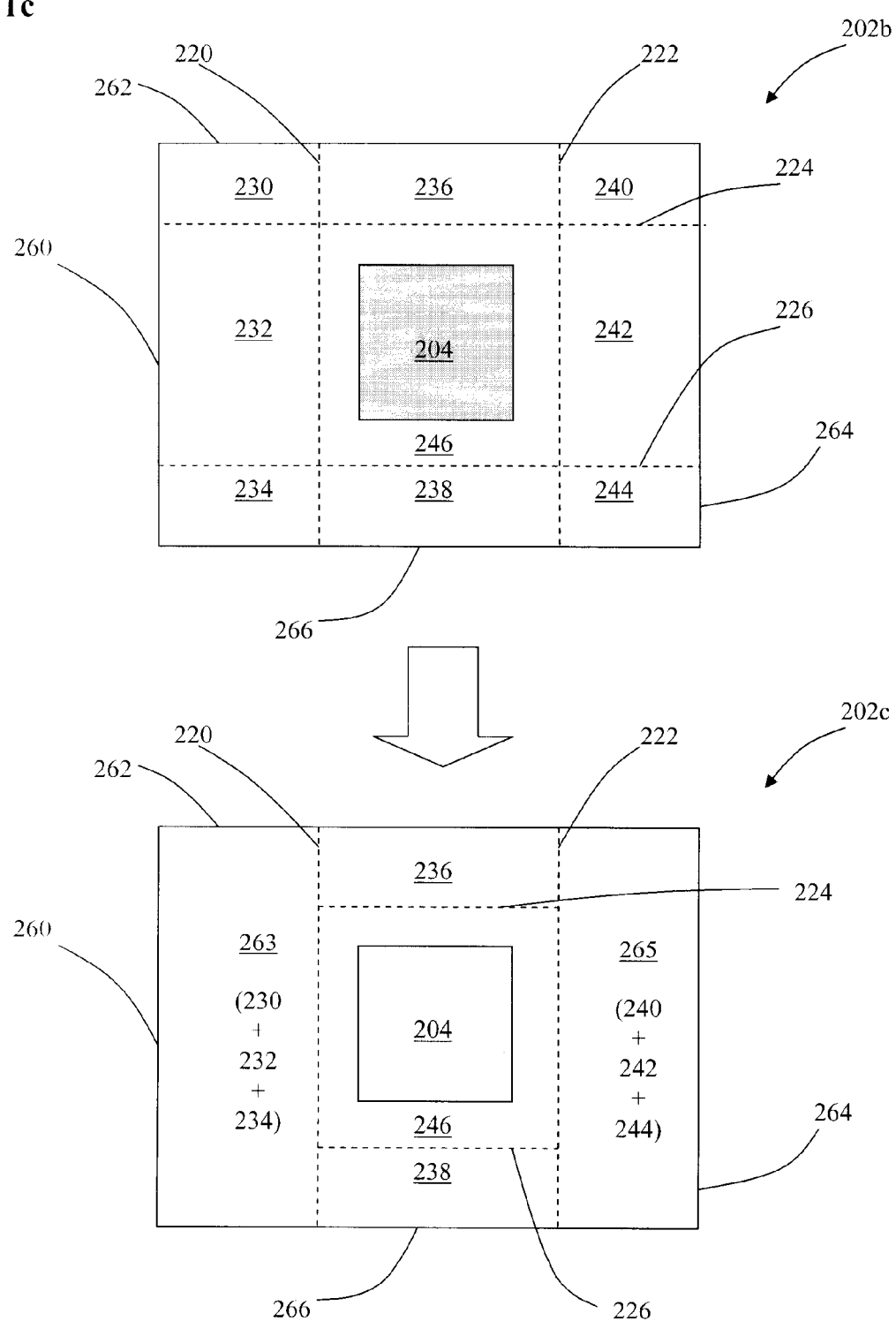

Once the free space tiles have been established, some or all of the free space tiles can be combined into larger free space tiles. Referring to FIG. 1c, it can be seen that free space tiles 230, 232, and 24 have been combined into a single large free space tile 263 along the left portion of the window 202c. Similarly, free space tiles 240, 242, and 244 have been combined into a single large free space tile 265 along the right portion of window 202b.

Alternatively, these larger free spaces 263 and 265 are initially created when the free space tiles are identified, such that the breakup of space in the area of window 202 is not symmetric. This allows the tiles in one area (i.e., free space tiles 263 or 265) to extend all the way to the edges of the used space tile 246, but tiles in other areas do not, i.e., free space tiles 236 and 238. In one embodiment, this is considered "preferred vertical" fracturing that can be used on a layer with preferred vertical routing. In an embodiment, the preferred fracturing direction of each layer is controllable and optional.

The process of tessellating a chip portion or area into space tiles can also be referred to as space tile "punch." During the punch process, identification is made of all the shapes that affect the area and which affect the formation of space tiles. In one approach, punching a shape leaves a hole in the tile area where the shape being punched is located. Alternatively, the used space tiles can be left behind.

Figure 1D:
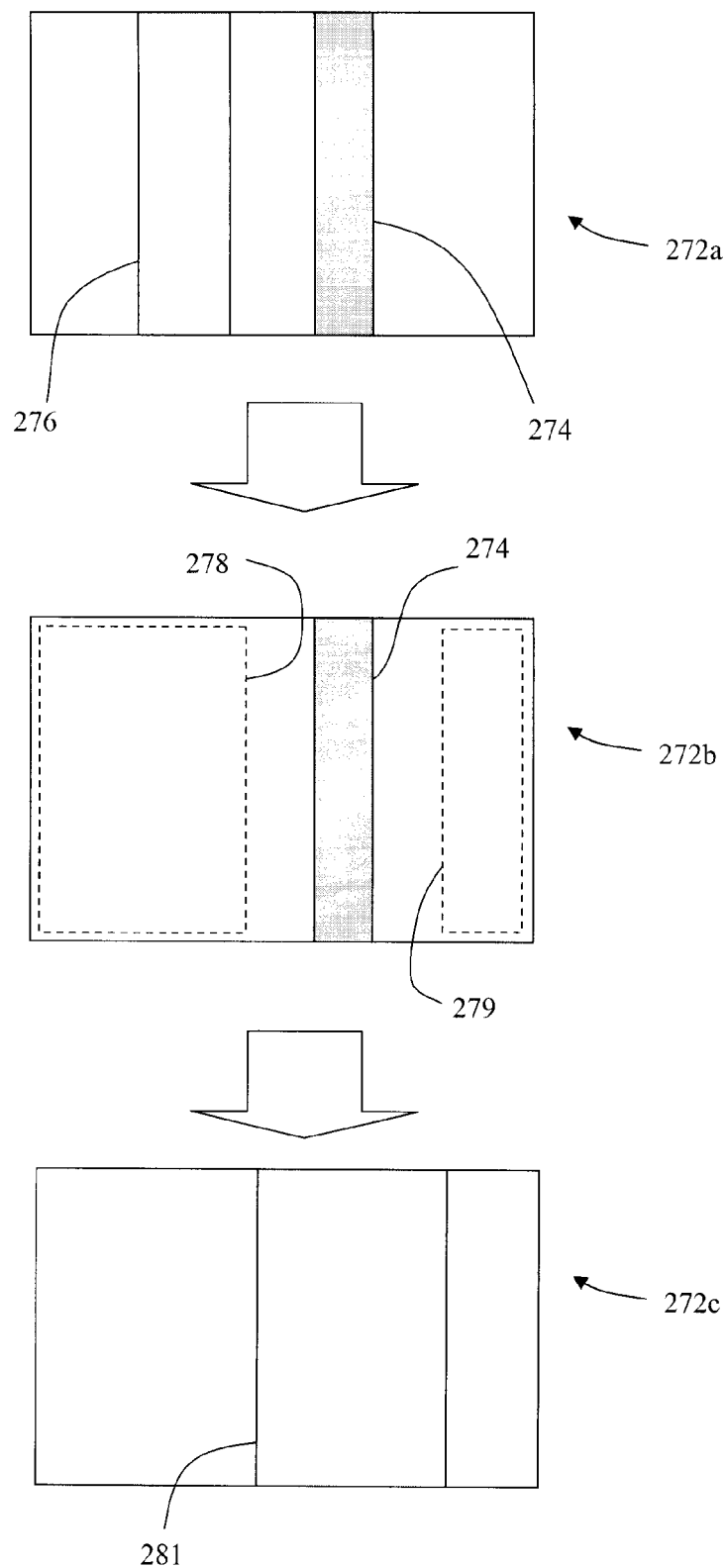

When performing a punch against an object, this action identifies free space tiles against a version of the window in which the object does not appear since the object is possibly being moved. Referring to FIG. 1d, shown is a window 272a containing object 276 and object 274. Consider if it is desired to perform a space tile punch against object 276, i.e., to determine the tree space tiles in window 272a with respect to object 276.

Revised window 272b shows the result of performing a space tile punch against object 276. As previously noted, the space tile punch operation determines the free space tiles after the subject object has been removed from consideration. After removing object 276, only object 274 remains as a show in window 272b. Thus, the free space tiles are identified based upon the contours of object 274. Here, the result of the space tile punch is a first free space tile 278 along the left edge of the window 272b and a second free space tile 279 along the right edge of window 272b. Note that these free space tiles do not extend directly against the remaining object 274. For the purposes of performing the punch operation, object 274 is considered an obstruction, and the free space tiles are adjusted to ensure compliance with distance requirements for the design rules. Thus, the boundaries of free space tiles 278 and 279 are adjusted away from object 274 to a clearance distance corresponding to DRC correctness requirements. Free space tiles 278 and 279 now identify the boundaries (with respect to object 276) of the locations/paths at which object 276 can be permissively moved within window 272b. Revised window 272c shows an inverted view in which the entire region that is considered unavailable is shown as a used space tile 281.

The examples of FIGS. 1a-d illustrates one approach for identifying orthogonal space tiles. It is noted that similar approach can also be used to form non-orthogonal space tiles, if non-rectangular shapes exist in the region of interest on the chip. Further details of an exemplary approach for implementing space tiles is disclosed in U.S. Pat. No. 7,096,445, which is hereby incorporated by reference in its entirety.

Space-Tile-Based Routing

One application for space tiles is to identify possible wire routes in an IC design. As noted above, specified portions of an IC design can be tessellated into identified regions of free and used space tiles. Spacing rules are applied to ensure that an object can legally be placed in the free space tiles without violating design rules. By appropriately defining the location and configuration of the free space tiles, routing paths can be identified along the free space tiles for wires in the design. In one embodiment, the boundary lines of the free space tiles are used to show the permissible boundaries of locations for the centerline of objects (e.g., wires) that can be placed at or through the free space tiles. Thus, the boundary lines actually form a "clearance shadow" that is the clearance distance plus half the width of the object that is to be placed. In other words, the boundaries of the free space tiles are identified such that an object can be permissively moved with its centerline overlaid on the free space tile boundary without causing a conflict with an existing object.

Figure 2:
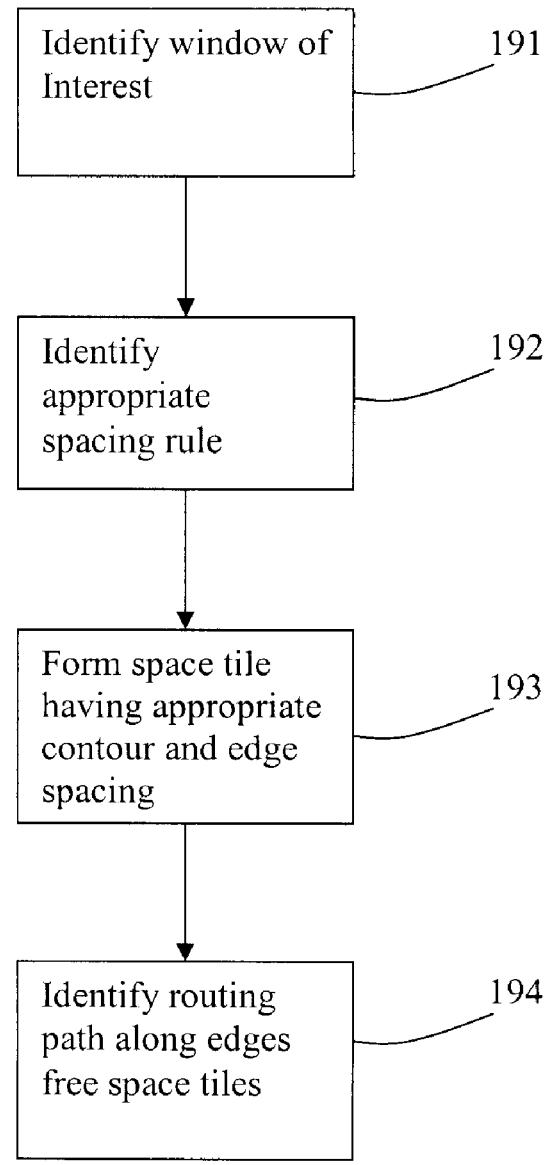
FIG. 2 shows a flowchart of an embodiment of a process for performing tessellation-based routing.

FIG. 2 shows a flowchart of an embodiment of a process for implementing this functionality in which the edges of the free space tiles are configured such that they inherently mark legal routing paths for the centerline of a wire. In this approach, if the contour of the free space tile is configured based upon the shape of a blockage and minimum spacing rules are applied, then a routing path defined by the outline of the free space tiles closest to a blockage essentially provides the closest legal path that can be taken to the blockage.

At 191, an identification is made of the window of interest in which it is desired to locate a routing path. At 192, the appropriate spacing rule is identified for the edge of the free space tiles to be formed in the window. The spacing rule for one embodiment of this approach is configured to form a minimum fence around blockages comprising half the width of the contemplated wire plus the appropriate clearance distance to avoid design rule violations. Based upon the established spacing rule, free space tiles are formed having appropriate contours and edge spacing related to one or more blockages (193). Because the spacing rule has been applied, the outline of the free space tiles adjacent to the blockage are now guaranteed to provide a legal routing path for a wire having the contemplated wire width. Therefore, a routing path can be identified along the edges of the free space tiles (195). Note that the edges of the free space tiles therefore inherently provide legal routing paths for a contemplated wire, as a result of defining the outline of the free space tiles.

Figure 3:
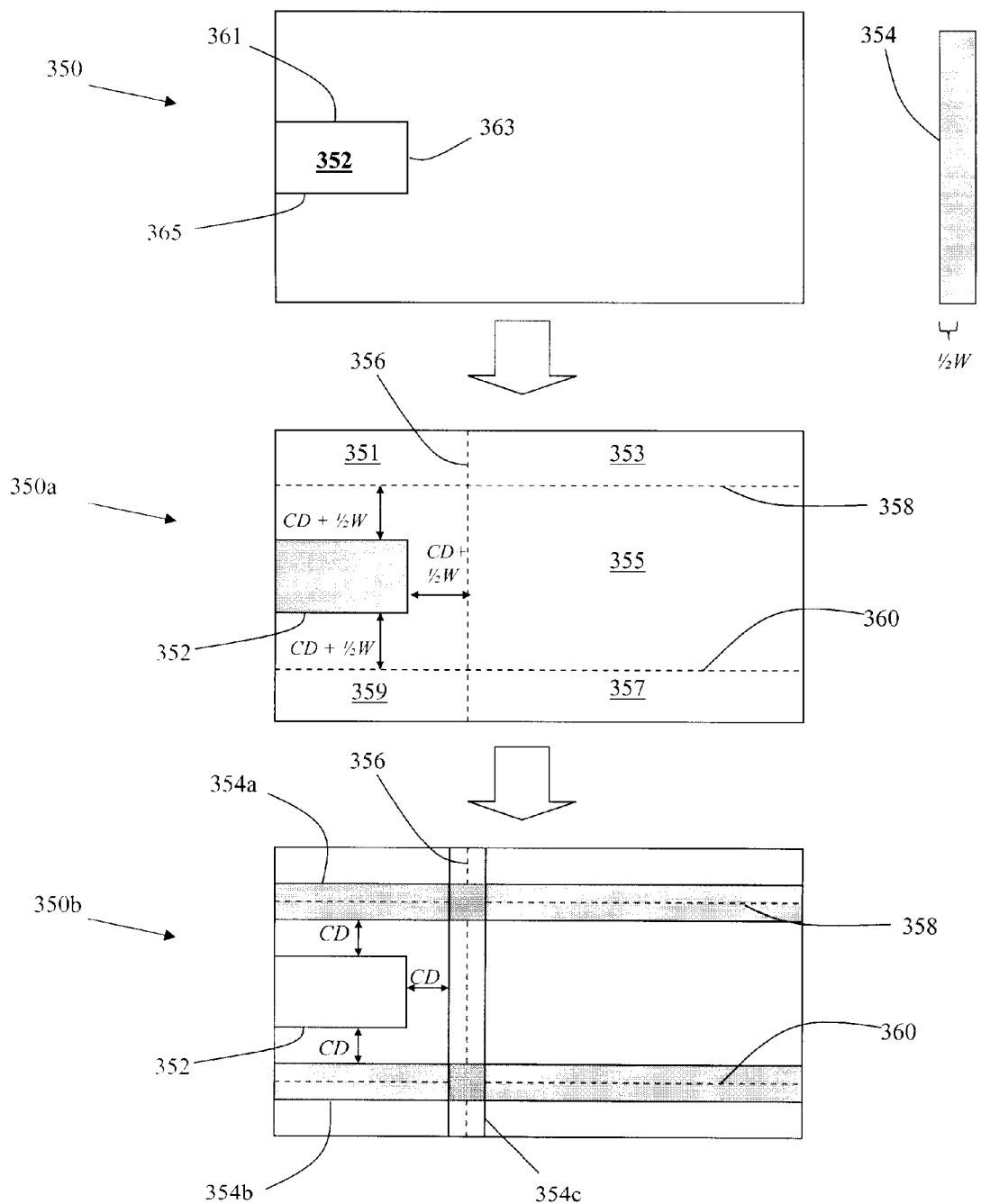
FIG. 3 illustrates an example of tessellation-based routing according to an embodiment of the invention.

FIG. 3 illustrates an example of this approach for identifying a routing path. A blockage 352 is shown along the left side of the window 350. Consider if it is desired to identify the closest legal routing paths that can be established with respect to blockage 352 for a wire 354 having a width W.

As shown in window 350a, to ensure that the contours of free space tiles follow the contour of blockage 352, boundary lines 358, 356, and 360 are established that follow the shape of the top edge 361, right edge 363, and bottom edge 365 of blockage 352. These boundary lines 358, 356, and 360 (in combination with the edges of the window 350) define the location and contour of free space tiles 351, 353, 355, 357, and 359. A spacing rule is applied that creates a minimum space of one-half the wire width (½W) plus a specified clearance distance (CD) between the obstruction and the boundary of the adjacent free space tiles.

The boundary lines 356, 358, and 360 along the contour of the free space tiles 351, 355, 359 adjacent to blockage 352 provide possible legal routing paths for wire 354. In particular, these boundary lines identify locations for which the centerline of wire 354 can legally be routed without violating design rules. As depicted in window 350b, if a wire 354a is routed with its centerline along boundary line 358, the minimum clearance distance CD is maintained between wire 354a and blockage 352. Similarly, if wires 354b or 354c are routed with its centerline along boundary line 356 or 360, the minimum clearance distance CD would still be maintained between wires 354b and 354c and blockage 352.

Figure 4:
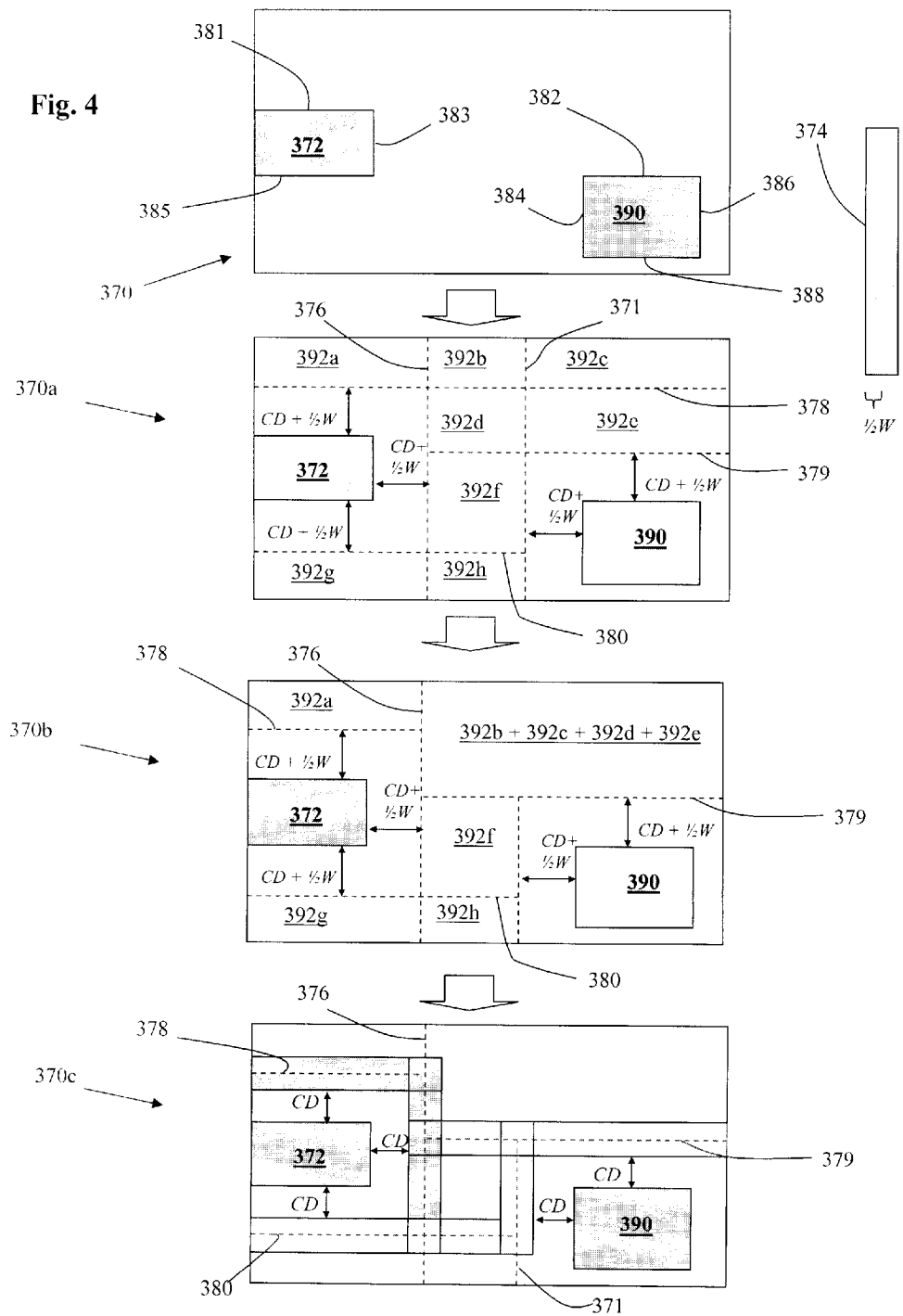
FIG. 4 illustrates an example of tessellation-based routing with multiple blockages according to an embodiment of the invention.

When multiple punch operations are performed against multiple blockages, the border(s) of the resulting free space tiles identify the available legal routing path(s) against the entire set of blockages. Referring to FIG. 4, shown is a window 370 containing two blockages 372 and 390. Consider if it is desired to identify the closest legal routing paths that can be established with respect to blockages 372 and 390 for a wire 374 having a width W.

As shown in window 370a, to ensure that the contour of free space tiles follow the contour of blockage 372, boundary lines 376, 378, 379, 380, and 371 are established that follow the shape of the top edge 381, right edge 383, and bottom edge 385 of blockage 372 as well as top edge 382 and left edge 384 of blockage 390. These boundary lines 376, 378, 379, 380, and 371 (along with the edges of the window 350) define the location and shapes for free space tile 392a-h. A spacing rule is applied that creates a minimum space of one-half the wire width (½W) plus a specified clearance distance (CD) between the blockages 372 and 390 and the boundary of their adjacent free space tiles. It is noted that in this example, empty space exists to the right and bottom of blockage 390 but no free space tiles have been identified in those areas of window 370a. This is because those empty spaces are too small to fit free space tiles once the appropriate spacing rule has been applied. Therefore, those areas do not contain enough space that can legally fit any additional wires or other objects, and are therefore not identified as free space tiles.

Merge operations may be performed against the space tiles. One possible reason for performing a merge operation is to reduce the number of free spaces that is processed to identify appropriate contours for routing. As shown in revised window 370b, free space tiles 392b, 392c, 392d, and 392e have been merged into a single free space tile.

As depicted in window 370c, the boundary lines 376, 378, 379, 380, and 371 along the contour of the free space tiles adjacent to blockages 372 and 390 provide possible legal routing paths for wire 374. In particular, these boundary lines identify the closest possible locations to the obstructions for which the centerline of wire 374 can legally be routed without violating design rules. As can be seen, multiple possible routing paths and path segments have been identified along the edges of the free space tiles.

Figure 5:
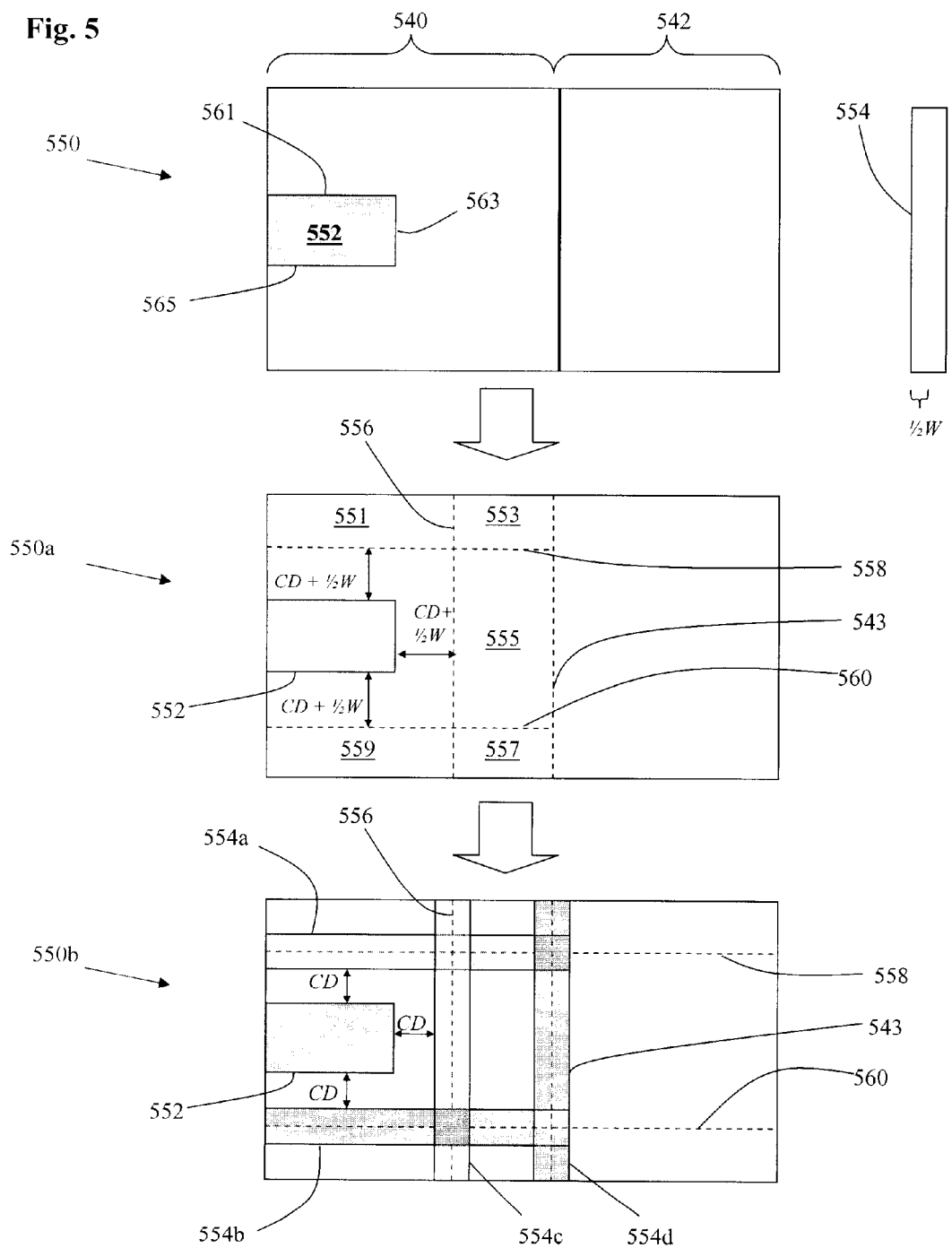
FIG. 5 illustrates an example of tessellation-based routing with enclosing windows according to an embodiment of the invention.

An enclosing window may be introduced to limit the extent of the free space tiles, and thus confine the resulting routing paths within a desired area of the design. Referring to FIG. 5, shown is a portion of an integrated circuit design 550 that contains a blockage 552. An enclosing window 540 has been introduced to limit the extent of boundaries for any free space tile that may be formed against blockage 552.

As before, consider if it is desired to identify the closest legal routing paths that can be established with respect to blockage 552 for a wire 554 having a width W. As shown in window 550a, to ensure that the contour of free space tiles follow the contour of blockage 552, boundary lines 558, 556, and 560 are established that follow the shape of the top edge 561, right edge 563, and bottom edge 565 of blockage 552.

Here, the extent of the boundary lines ends at the border of the enclosing window 540, forming another boundary line 543. These boundary lines 558, 556, and 560 (along with boundary line 543) define the location and shapes for the resulting free space tiles as well as the possible legal routing paths for wire 554. Therefore, as shown in 550*b*, applying the enclosing window 540 in this example has restricted the identified routing paths to only the left side of 550*a*. Another enclosing window 542 encompasses the right portion of 550. The disclosed process may be applied against either or both enclosing windows 540 and 542.

Figure 6:
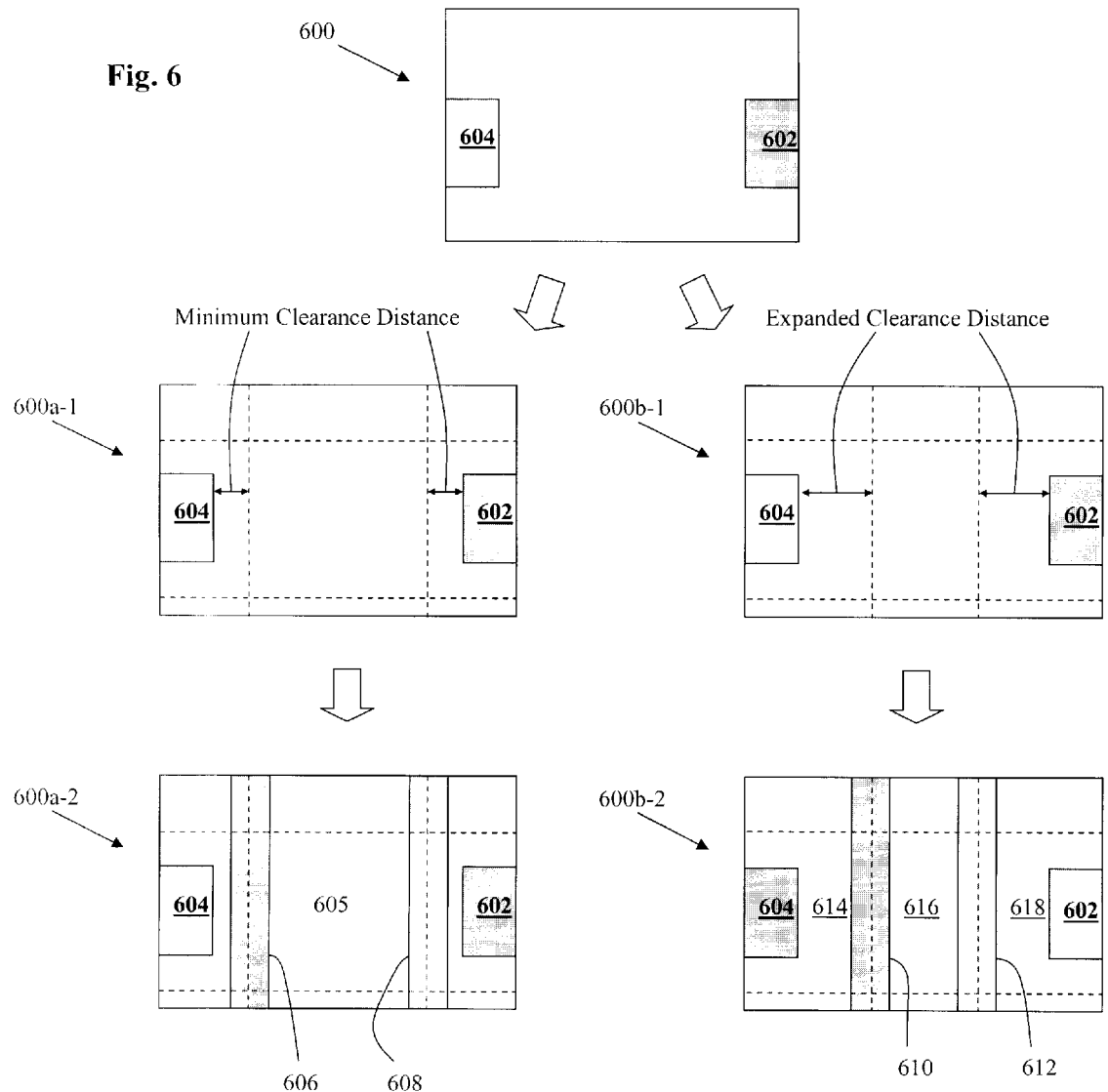
FIG. 6 illustrates an example of tessellation-based routing with an expanded clearance distance according to an embodiment of the invention.

The spacing rules may be modified to accomplish desired placement and routing effects in the design. An example of a desired effect that can be accomplished is to increased the minimum spacing between blockages and the outline of their adjacent free space tiles to spread wires in the design, e.g., to reduce crosstalk or to eliminate excessive open space. To illustrate, shown in FIG. 6 is a window 600 containing two blockages 602 and 604. Window 600*a*-1 shows the formation of free space tiles in which a spacing rule has been applied to locate the contour of the adjacent free space tiles a minimum clearance distance away from the blockages. If the spacing rule specifies that only a minimum clearance distance is to be formed for these free space tiles, then when wires 606 and 608 are routed through the design, the paths for these wires 606 and 608 are the closest possible distance to blockages 602 and 604.

This creates a large open space 605 between wires 606 and 608. This large open space 605 is desirable if the design intends to place additional objects or wires within window 600*a*-2. However, if no additional objects are to be placed in large open space 605 in window 600*a*-2, then additional corrective action may need to be taken to avoid manufacturing defects in the IC due to excessive amounts of empty space in the design, e.g., by placing metal-fill in the large open space 605.

When forming the contours of free space tiles, the spacing rules may be adjusted to eliminate this type of open spaces and to spread wires in the design. As shown in window 600*b*-1, the contours of free space tiles adjacent to blockages 602 and 604 have been adjusted by an expanded clearance distance that is larger than the minimum clearance distance. The expanded clearance distance can be selected to locate the available routing paths anywhere that is legal in the design. If it is desired to eliminate excessive open space, then the expanded clearance distance will provide more uniform and/or less excessive spacing for wires routed along the outline of free space tiles. In addition, expanded spreading of wires can be used to reduce the effects of crosstalk in the design.

Window 600*b*-2 shows vertical wires 610 and 612 routed along of the border of the adjacent free space tile(s) at the expanded clearance distance relative to blockages 602 and 604. Here, it can be seen that spaces 614, 616, and 618 have been formed between the blockages 604 and 602 and the wires 610 and 612. Spaces 614, 616, and 618 are more uniform and less excessive than the large open space 605 shown in window 600*a*-2.

The specified clearance distance can be adjusted in specific directions to enable spreading in desired directions. For example, expanded offsets can be applied to clearance distances only in the east-west directions, to ensure spreading only in those directions but not in the north or south directions.

Other placement and routing effects may be effected by adjusting the spacing rules. For example, permissible wire widths may be manipulated to allow wires to be routed through free space tiles that are smaller than formal design rule requirements, but which are acceptable from a performance perspective, e.g., to form neck down wires.

Any routing/placement applications may be performed using the present space tile approach. As described in more detail below, examples of particular routing/placement applications include "packing" and "pushing" of wires and components in the design.

Space Tile Pack

One application of using space tiles to identify a legal routing path is to provide a method and mechanism in which space tiles are employed to implement object packing for an integrated circuit. The objective is to move one or more objects to accomplish more efficient space utilization of the region inhabited by the objects on the chip. Space tiles are used to facilitate movement of the objects.

Figure 7:
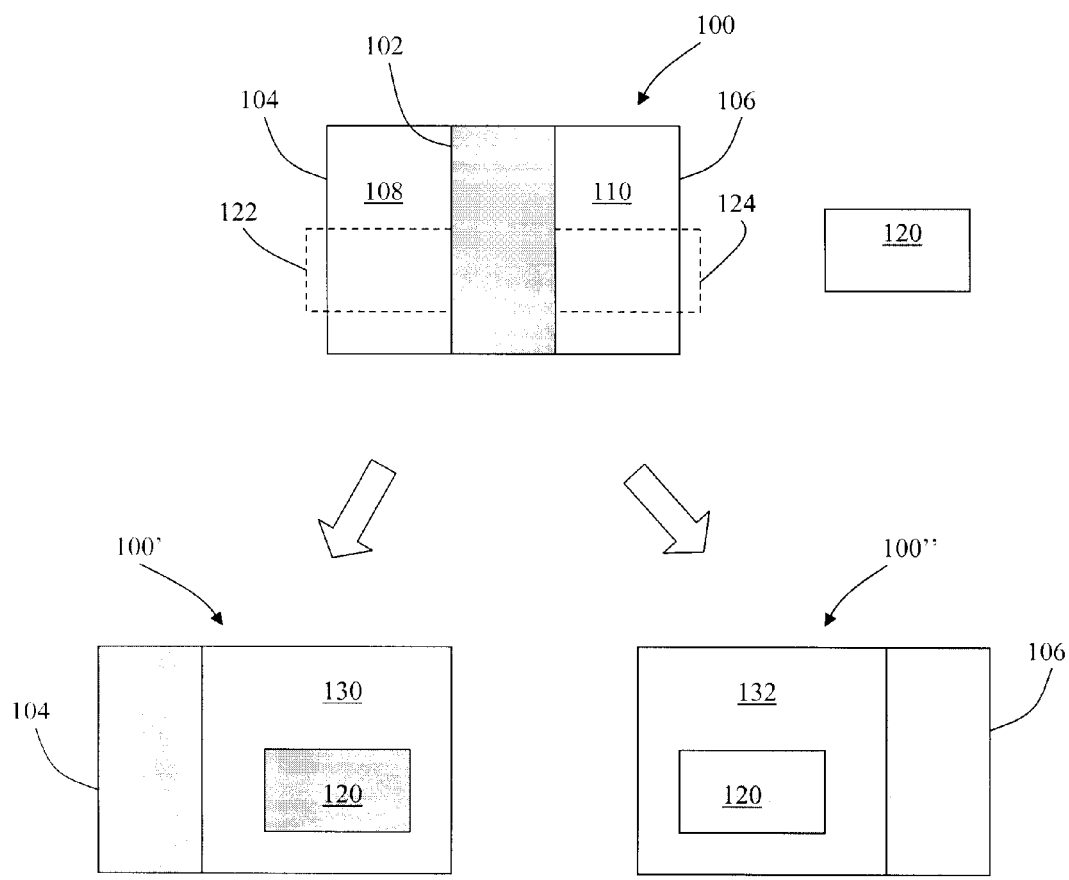
FIG. 7 generally illustrates the process of packing.

With reference to FIG. 7, a portion 100 of an IC design is shown. A wire segment 102 extends through the middle of chip portion 100. This leaves portions 108 and 110 available on either side of wire segment 102 for placement/routing of other objects. Consider if the designer would like to place an object 120 within chip portion 100. Here, object 120 cannot be placed into chip portion 100 because no available space exists that is large enough to fit this object. To illustrate this, assume that outline 122 shows object 120 being overlaid onto available portion 108 in chip portion 100. It can be seen that object 120 would extend beyond the boundaries of available portion 108. Similarly, outline 124 shows object 120 being overlaid onto available portion 110 in chip portion 100. Here, object 120 would also extend beyond the boundaries of available portion 110. When packing is employed, wire segment 102 is moved to an edge of chip portion 100, e.g., edges 104 or 106 of chip portion 100. Moving wire segment 102 from the middle of chip portion 100 to an edge will create greater open space which can expectantly be used to locate larger objects. For example, modified chip portion 100' shows the result if wire segment 102 is packed along left edge 104. This movement creates a larger open space 130, which is now large enough to fully hold object 120. Similarly, modified chip portion 100" shows the result if wire segment 102 is packed along right edge 106. This movement also creates a larger open space 132, which is large enough to fully hold object 120.

Figure 8:
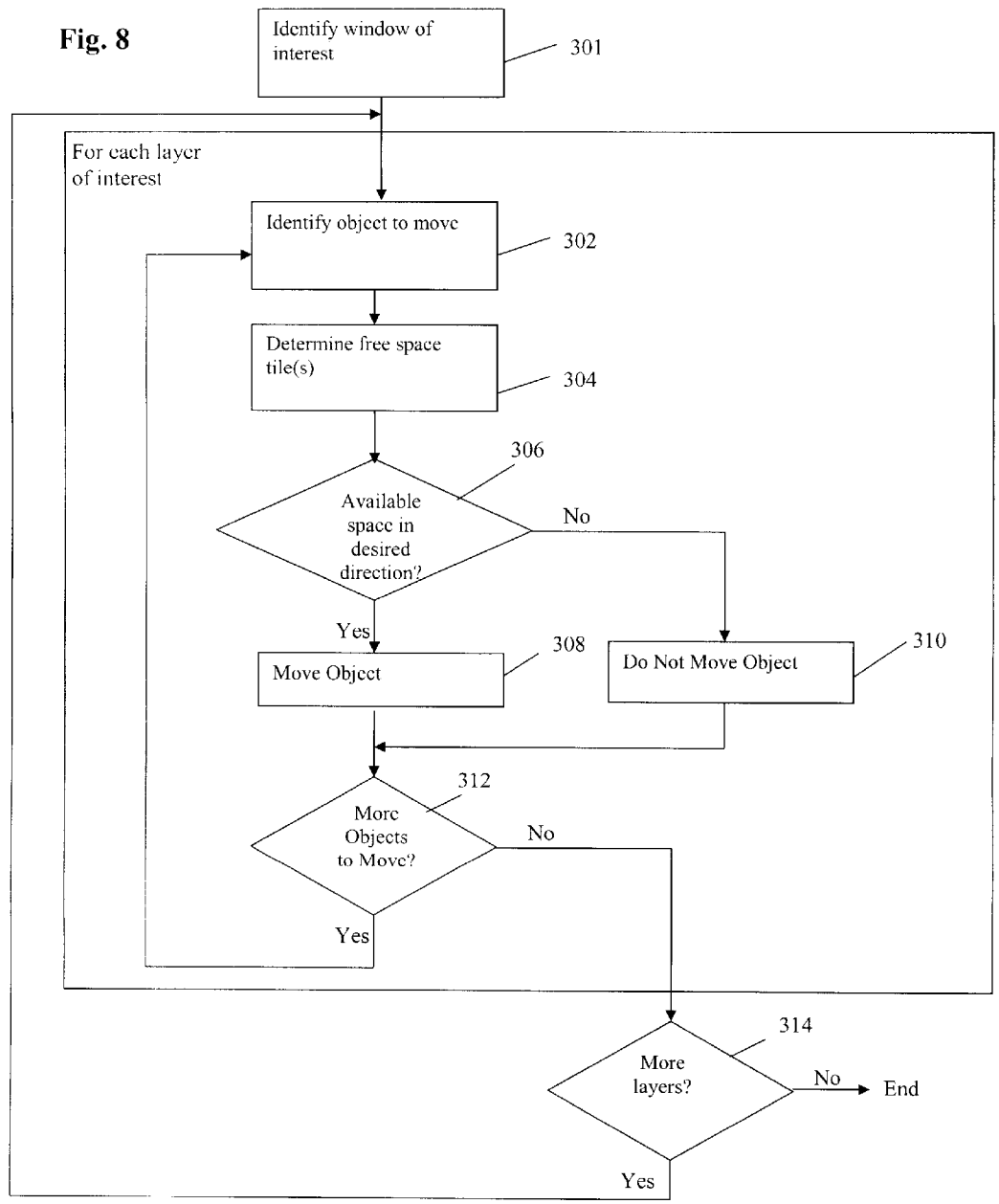
FIG. 8 shows a flowchart of an embodiment of a process for space tile based packing.

FIG. 8 shows a flowchart of a process for space-tile based packing according to an embodiment of the invention. In one embodiment, packing always occurs along the same edge or packing direction of a window. A selection may be performed to determine which direction packing is performed. Generally, if wires are the main objects to be packed, packing occurs along an edge of the window running parallel to the routing direction. For clockwise packing, if the routing direction is vertical top-down, the wires and other movable objects would be packed against the right edge of the window. For counter-clockwise packing, the wires and other movable objects would be packed against the left edge of the window. In an alternate embodiment, objects can be packed in multiple directions within the window, e.g., against two or more different window edges.

At 301, an identification is made for the window of interest. Any appropriate partitioning or tessellation approach may be used to define the window of interest. In addition, any suitable granularity may be employed to define the size and scope of the window of interest.

At 302, for each layer of interest, an identification is made of an object to move. If multiple objects in a window are eligible to be packed, the objects within in the window can be processed in an order determined by the distance of the object to the edge identified for packing. For example, the closest eligible object to the edge in the packing direction is packed first, then the next closest eligible object, etc. With respect to eligibility of an object for packing, certain objects or categories of objects can be excluded from the packing process. For instance, a designer may designate power or ground nets as "fixed" and therefore not subject to the packing process. In one embodiment, all wires are subject to packing, except those specifically designated as being fixed. Other and additional objects, in addition to wires, can also be designated as being eligible for packing.

With respect to the identified object to move, a space tile punch is performed to identify eligible locations to which the object can be moved. At 304, a first action of the punch process is to determine the free space tile(s) in the window that is available for holding more geometric shapes. Since the identified object is possibly being moved, this action of identifying free space tiles is performed against a version of the window in which the object does not appear. To ensure that movement of the object is DRC correct, the free space tiles can be adjusted to account for design rule correctness. For example, a fence or offset can be located around each obstruction, and the dimensions of the free space tile is adjusted to account for the fence or offset.

The next action is to determine whether the free space tile(s) have sufficient space to contain the object in the desired direction for movement (306). In one approach, the free space tile will not be considered "free" unless it has sufficient space for storing the object, subject to DRC rules. Thus, the border of the free space tile can be established to identify the furthest dimensional location available for placement by the object to be moved. The free space can be con figured to show the centerline of the wire or object to be moved, i.e., the border of the free space tile is specified such that it marks the eligible movement location for the position of the centerline of the object being moved. Objects outside of the window can be considered to identify the available movement locations for the object, e.g., to determine how close to a window edge the object can be moved.

If available space exists for the object in the direction of desired movement, then the object is moved in the desired packing direction (312). In one embodiment, the object to be moved is moved along the edges of the free space tiles such that the movement/routing path of the object is along the edges of the free space tiles furthest towards the desired packing direction. Otherwise, the object is not moved (310). In an alternate embodiment, if the object cannot be moved in the desired packing direction, another direction of movement is checked to see if efficient packing can still occur in another packing direction. A determination is made whether there exists other objects to move (312). If so, the process returns to 302 to process the additional objects.

If there are no further objects to move in the layer, then a determination is made whether there is an additional layer to process (314). If so, then the process returns to 302 to process the object(s) in the additional layer. Otherwise, the process ends. In one embodiment, an enclosing window may be used to confine the extent and direction of packing.

Figure 9:
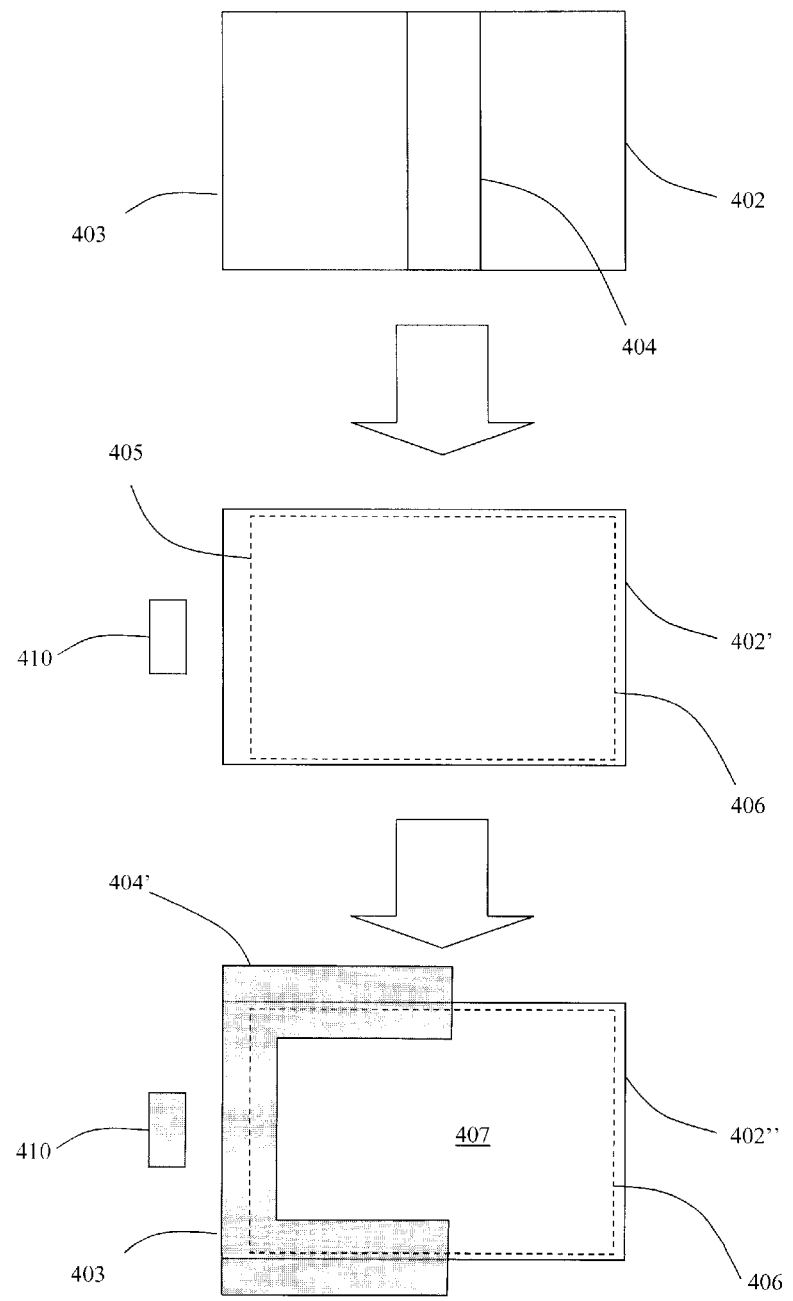

FIG. 9 illustrates a first example of a packing process according to an embodiment of the invention. Shown is a window 402 containing a wire segment 404. Consider if it is desired to pack wire segment 404 in the direction of window edge 403 (to the left edge of the window).

First, a space tile punch is performed to identify the available locations within window 402 to move wire segment 404. Referring to window 402', this demonstrates the presently embodied approach to determine the free space tile(s) for moving wire segment 404. The object to be moved (wire 404) is removed from the window 402' when making the identification for free space tiles. Once wire 404 has been removed, the free space tile(s) for the window 402' is determined. Here, since there are no other objects in the window, a single free space tile 406 is created which essentially covers the entire window.

In the present embodiment, the border of the free space tile corresponds to the centerline of the available location to move the object. The boundaries of the free space tile are adjusted to ensure that design rules are not violated when the object is moved to the space tile. Objects in neighboring windows can be considered when determining the boundary of the free space tile. Here, an object 410 exists in the neighboring window to the left of window 402'. Thus, the left boundary 405 of free space tile 406 is shifted away from object 410 for a distance corresponding to correct design rule requirements.

Once the correct boundaries have been established for the free space tile 406, the object to be moved is shifted as far as possible in the desired direction of movement. Referring to window 402", the wire segment 404' is shown packed against the left edge 403 of the window. This packing process has now created a large open space 407 along the middle and right side of window 402". It is noted that when an object is moved, e.g., wire 404', the start and end points of the moved object may be projected to ensure that it properly connects to connecting structures in other windows, unless those connecting structures are also shifted correspondingly to the movement of the moved object.

Figure 10:
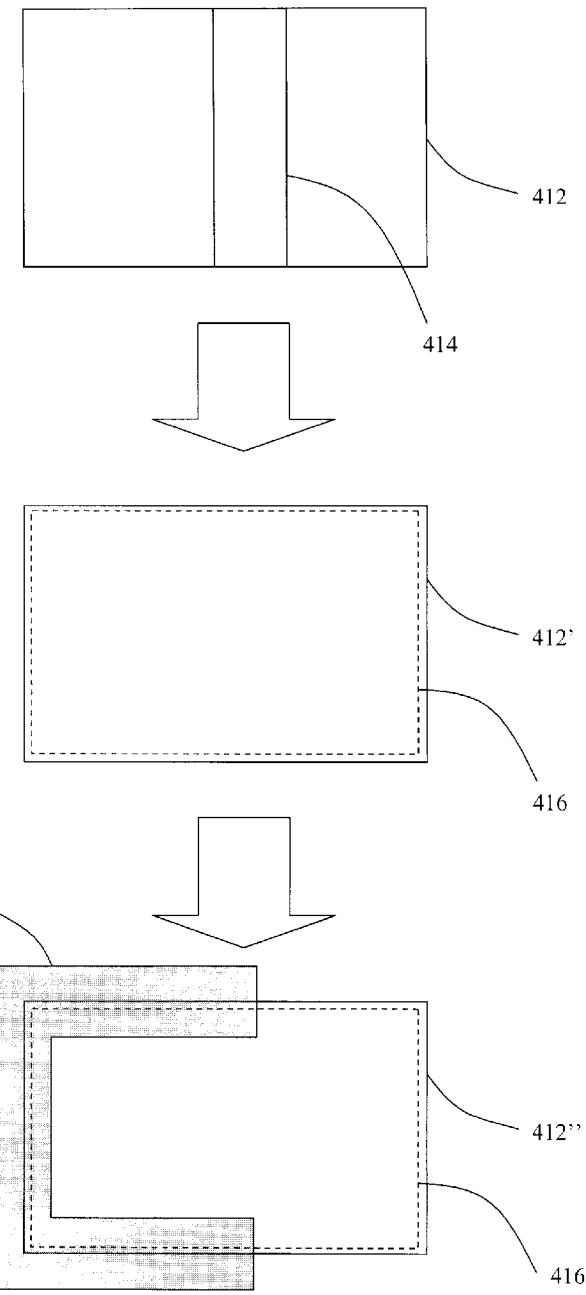

FIG. 10 depicts a similar example to that shown in FIG. 9, in which a window 412 contains a wire segment 414. Again, it is desired to pack wire segment 414 against the left edge of window 412. Unlike the example of FIG. 9, the left-neighboring window does not have an object near the left edge of window 412. Thus, the free space tile 416 identified by performing a space tile punch for wire segment 414 extends over the entire window, and does not need to be adjusted inward to comply with DRC checking requirements. When wire segment 414' is packed against the left edge of window 412, it can be seen that in this example, a portion of wire segment 414' also extends into the neighboring window. This is permissible since, as noted previously, there is no nearby object in the neighboring window that would cause a DRC violation if wire segment 414' is partially routed through that neighboring window.

Figure 11A:
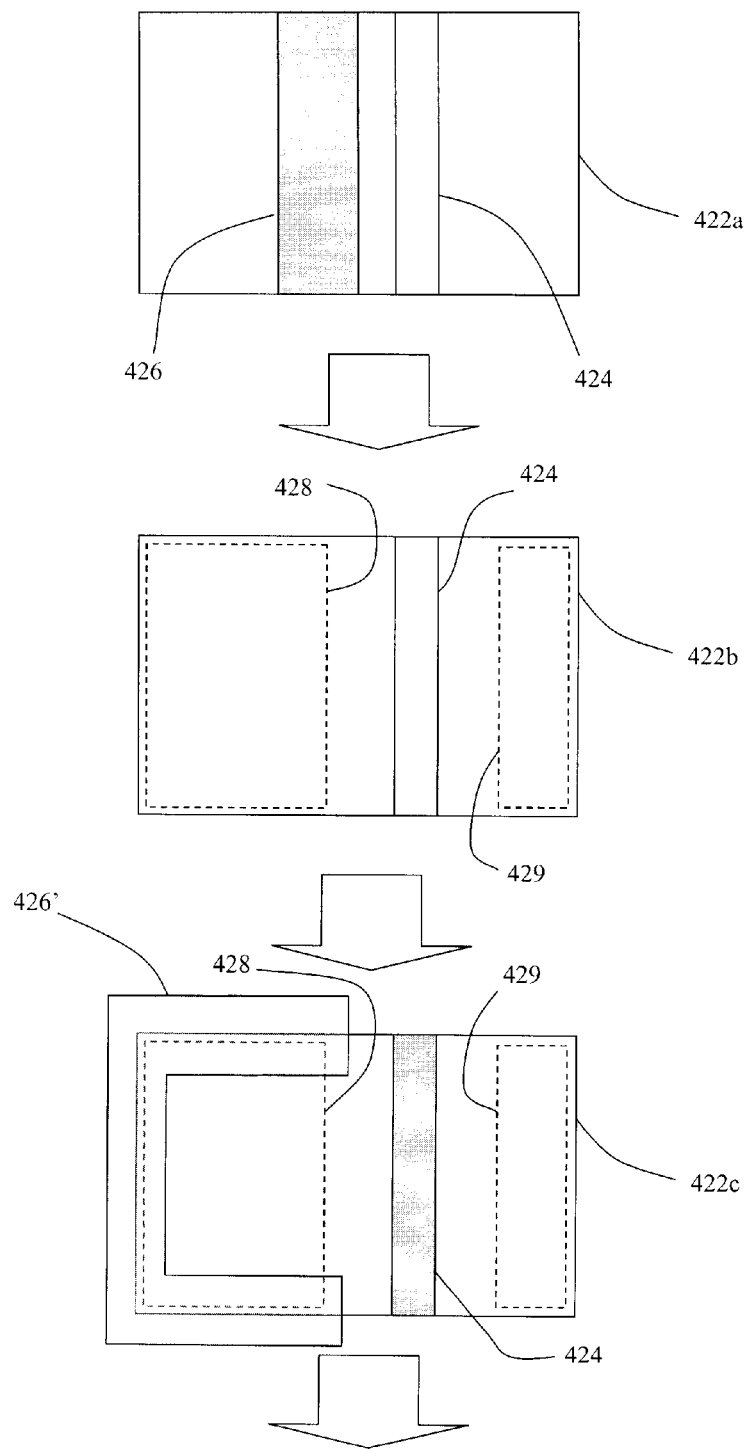

FIGS. 11a and 11b illustrate an example of the present embodiment of the packing process when packing multiple objects within a window. Window 422a in this example contains wire 426 and wire 424. Consider if it is desired to pack the wires along the left edge of window 422a. The ordering of objects to move is selected such that the object closest to the desired direction of movement is processed first. Thus, since wire 426 is closer to the left edge than wire 424, wire 426 is processed first.

Revised window 422b shows the result of performing a space tile punch against wire 426. As previously noted, the space tile punch operation determines the free space tiles after the subject object has been removed from consideration. The result of this operation is a first free space tile 428 along the left edge of the window 422b and a second free space tile 429 along the right edge of window 422b. Note that these free space tiles do not extend directly against the other wire 424. For the purposes of performing the punch operation, wire 424 is considered an obstruction, and the free space tiles are adjusted to ensure compliance with distance requirements for the design rules. Thus, the boundaries of free space tiles 428 and 429 are adjusted away from wire 424 to a distance corresponding to DRC correctness requirements.

Since the desired packing direction is towards the left edge of the window, the wire 426 will be moved to the left side boundary of free space tile 428. The result of this movement is shown in window 422c, in which packed wire 426' now resides along the left edge of the window.

Referring to FIG. 11b, the next step is to pack the remaining wire 424. A space tile punch is performed to identify the free space tile 430 corresponding to the removal of wire 424 from the window. This results in the free space tile 430 shown in window 422d. It is noted that previously moved wire 426' forms an obstruction along the left edge of window 422d. Thus, the boundary of free space tile 430 is affected by the position and shape of wire 426'. In particular, the edge contours of wire 426' determines the contours of the left edge boundaries of the free space tile 430. Moreover, DRC compliance will cause the left boundary of free space tile 430 to shift to the right to prevent a DRC violation. Once the left boundary of free space tile 430 has been appropriately established, wire 424 packed along free space tile boundary furthest in the desired packing direction. The result of this movement is shown in window 422e, in which packed wire 424' now resides along the left-most boundary of free space tile 430, towards the left side of window 422e and next to packed wire 426'.

Figure 12:
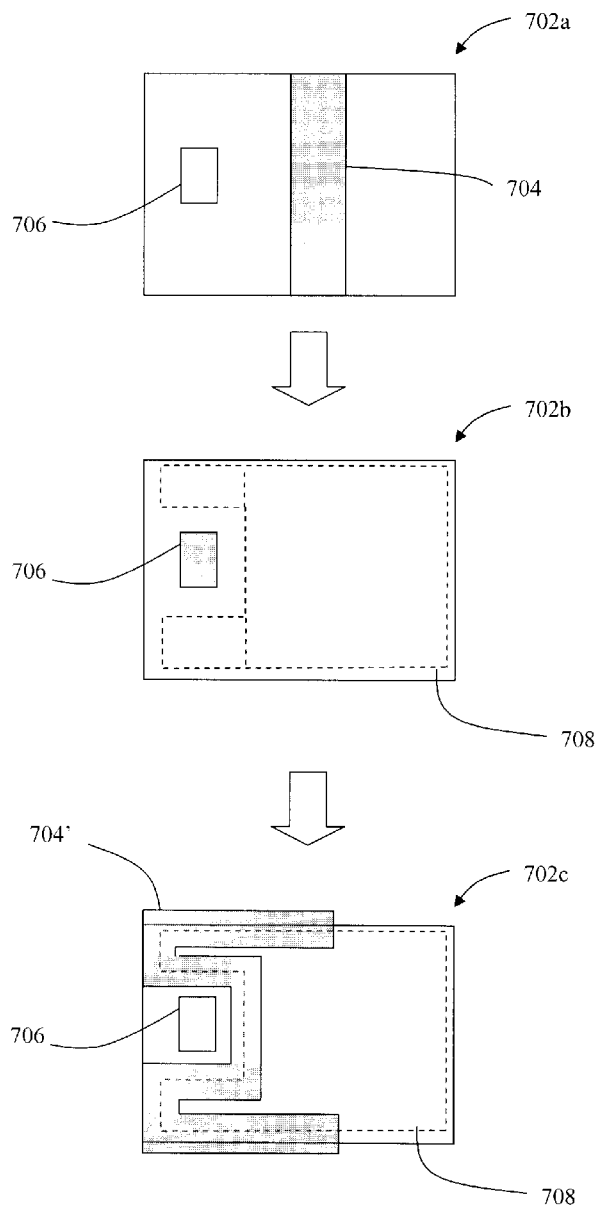

FIG. 12 illustrates another example of the present embodiment of the packing process. Window 702a contains a wire segment 704 to be packed and it is assumed that it is desired to pack this wire against the left edge of the window. Window 702a also contains an obstruction 706 that should not be moved.

The first step is to space tile punch the object to be moved. As shown in window 702b, free space tiles are identified in the window (after the wire 704 has been removed). To ensure compliance with applicable design rule requirements, a fenced distance is formed around the obstruction. The boundaries of the space tiles in window 702b are shifted to ensure that design rules will not be violated if the wire 704 is shifted to the boundary of the free space tiles. This may cause enough shifting such that a space tile that is "technically" free is no longer eligible to receive the object to be moved, and hence is no longer considered free. Here, it is noted the region to the left of obstruction 706 would normally contain a space tile. However, since design rules are being inherently enforced based upon the boundary of the free space tiles, no free space tile is formed in this example to the left of obstruction 706 since there is insufficient space in that region of the window to locate the wire and still meet design rule requirements.

Once the proper boundaries of the free space tiles have been established, the wire 704' is routed along the edges of the free space tiles such that the routing path is along the edges of the free space tiles furthest towards the desired packing direction. The result of this packing process is shown in window 702c, in which packed wire 704' is shown following the left-most edge of the various free space tiles in the window.

Figure 13:
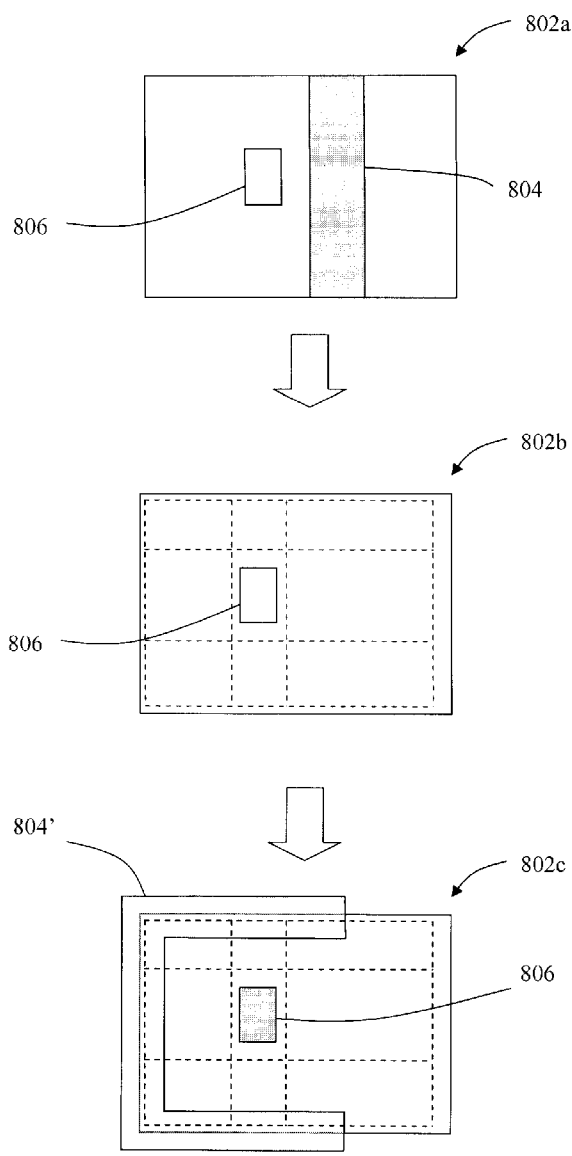

FIG. 13 illustrates a further example of the present embodiment of the packing process. Here, window 802a contains a wire segment 804 to be packed and it is assumed that the desired direction is towards the left edge of the window. Window 802a also contains an obstruction 806 that should not be moved.

A space tile punch is performed against wire 804 to determine the available locations to move this wire segment. As shown in window 802b, free space tiles are identified are identified to the left, right, above, and beneath the obstruction 806. It is noted that like the example of FIG. 12, a fenced distance is formed around the obstruction to ensure compliance with design rule requirements. This causes the free space tiles to be somewhat offset from the border of obstruction 806. Unlike the example of FIG. 12, the obstruction is far enough from the left edge of the window to allow a free space tile to exist to the left of the obstruction.

Once the proper boundaries of the free space tiles have been established, the wire 804' is routed along the edges of the free space tiles such that the routing path is along the edges of the free space tiles furthest towards the desired packing direction. In one embodiment, objects are permitted to "jump" over other objects to move in the desired packing direction. Here, wire 804 would need to jump over obstruction 806 to be packed as far as possible in the desired packing direction. The result of this packing process is shown in window 802c, in which packed wire 804' is shown following the left-most edge of the various free space tiles in the window.

Space Tile Push

Another application of using space tiles to identify a legal routing path is to provide a method and mechanism in which space tiles are employed to implement object push for an integrated circuit.

Referring to FIG. 14, consider another problem that may arise during the chip design process. Shown is a chip portion 152 containing a wire segment 154. For any number of reasons, the designer or EDA design tool may need to insert an object 156 at an exact location in the chip portion 152, even if that location is presently inhabited by wire segment 154. In some cases, packing, e.g., space tile-based packing, may be employed to shift wire segment 154 to either edge of the chip portion 152, leaving enough open space to place the object 156. However, the circuit design may be such that it is particularly desired to keep the wire segment as much as possible along its original path. If this is the case, then the act of packing the wire segment to either edge of the chip portion may, in fact, change the wire segment's path too extensively, beyond what is desired or necessary for the chip design. Here, it may be desirable to "push" the wire segment such that it is shifted only a minimum distance necessary to allow placement of object 156 while still maintaining maintain a legal routing path.

Figure 15:
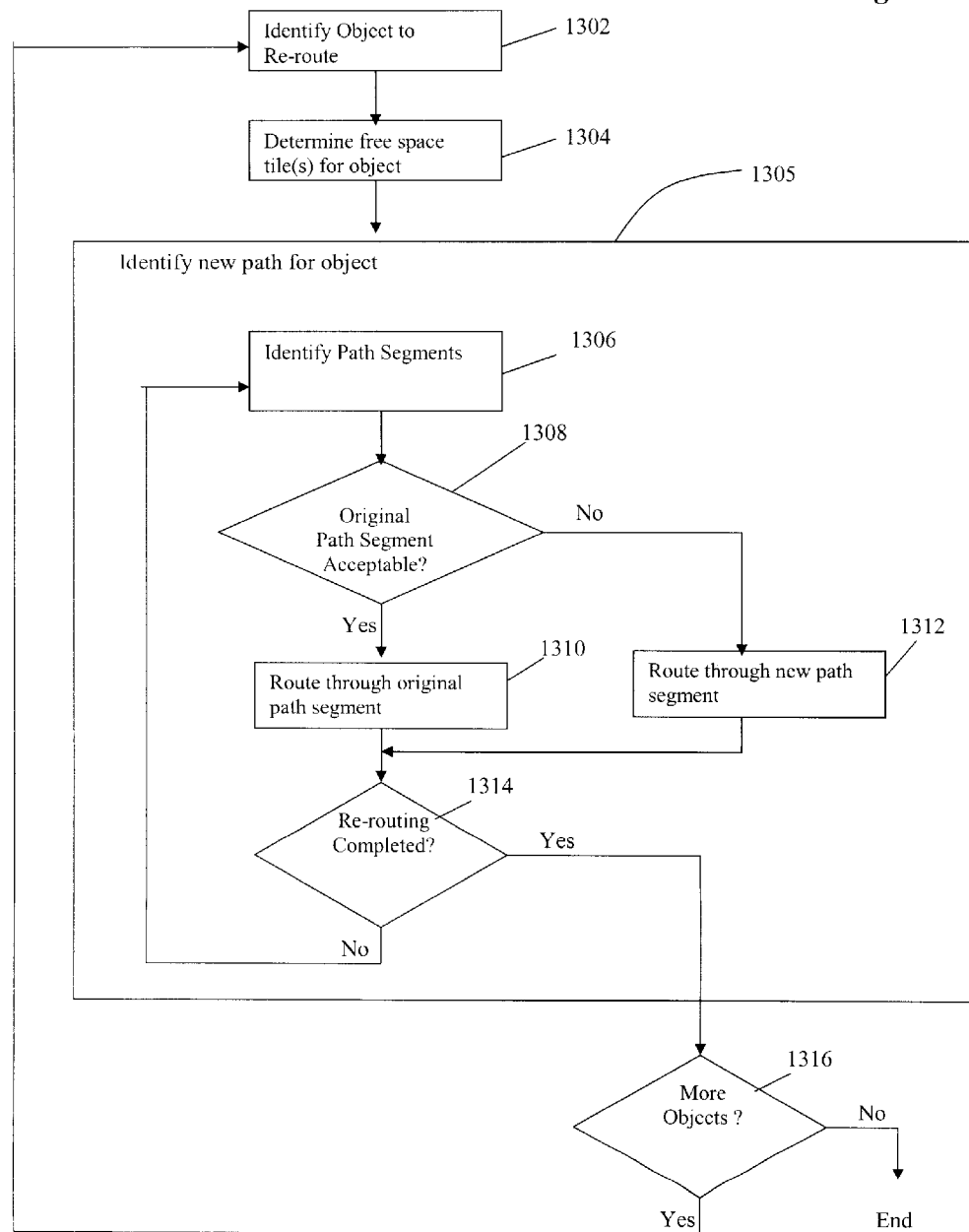
FIG. 15 shows a flowchart of an embodiment of a process for space tile based pushing.

FIG. 15 shows a flowchart of a process for implementing space tile push according to an embodiment of the invention. At 1302, an identification is made of an object to be moved or rerouted. For example, with reference to FIG. 14, if it is desired to place object 156 as indicated in window 152, then an identification would be made of the object that needs to be moved or rerouted, i.e., wire 154, to allow object 156 to be placed in the desired location. For the purposes of exposition, the present process is explained with regard to moving a wire segment. Therefore, terminology employed for this explanation is used to describe "rerouting" the wire to establish a new "path". However, this terminology is merely illustrative, and it is noted that the present process can be used to push any type of shape or object and is not to be limited to wires.

At 1304, a space tile punch is performed to determine the boundaries of the free space tiles with respect to the object being rerouted. FIGS. 1a-d show one example approach for determining the free space tiles with respect to an object to be rerouted. The result of 1304 is a set of free space tiles and their boundary lines, which identify the boundaries of the permissible new path(s) for the object to be moved. It is noted that at least two approaches can be taken when determining free space tiles. A first approach considers other objects that may be re-routable in the window when determining the bounds of the free space tiles. The second approach does not take these other objects into consideration, on the assumption that these other objects may also need to be rerouted during the process. Either approach may be employed.

At 1305, the new path is determined for the object being rerouted. As part of action 1305, an identification is made of each pertinent path segment for the wire being rerouted (1306). The consideration of a new path for the wire segment can be made on a segment-by-segment basis to allow the new path to be as close to topology of the original path as possible. Each path segment can delineated based upon a number of factors, such as intersection points, e.g., the intersection point between the original path for the wire and the closest available path established based upon the free space tiles of 1304. Multiple segments can be collectively identified and processed, e.g., if the multiple segments are defined by a common set of intersection points.

For the path segments, the process decides between the original path segment for the wire and the new path segment identified by the free space tiles. If the original path segment is acceptable (1308), e.g., the original path segment does not present a conflict or design rule violation, then the original path segment is retained for the final wire path (1310). Otherwise, the new path segment identified from the free space tiles is used as the new path segment (1312). This process continues until the entire wire has been rerouted, i.e., until all path segments for the wire has been established from one edge of the window to the other (1314).

A determination is made whether additional objects need to be rerouted (1316). This may occur, for example, because the new object that has been pushed onto the chip layout also overlaps or causes rules violations for additional objects. In addition, this may occur because the rerouting of the first object causes an impermissible overlap or rules violation with a second object. In either case, the additional objects are also rerouted to avoid an impermissible conflict. It so, then the process returns back to 1302 to continue rerouting the additional objects. If the object to be placed on the floorplan spans multiple layers, then it is possible that the actions shown in FIG. 15 are performed on a per-layer basis, for each layer in which a conflict exists and wires are to be rerouted to avoid the conflict.

Figure 16A:
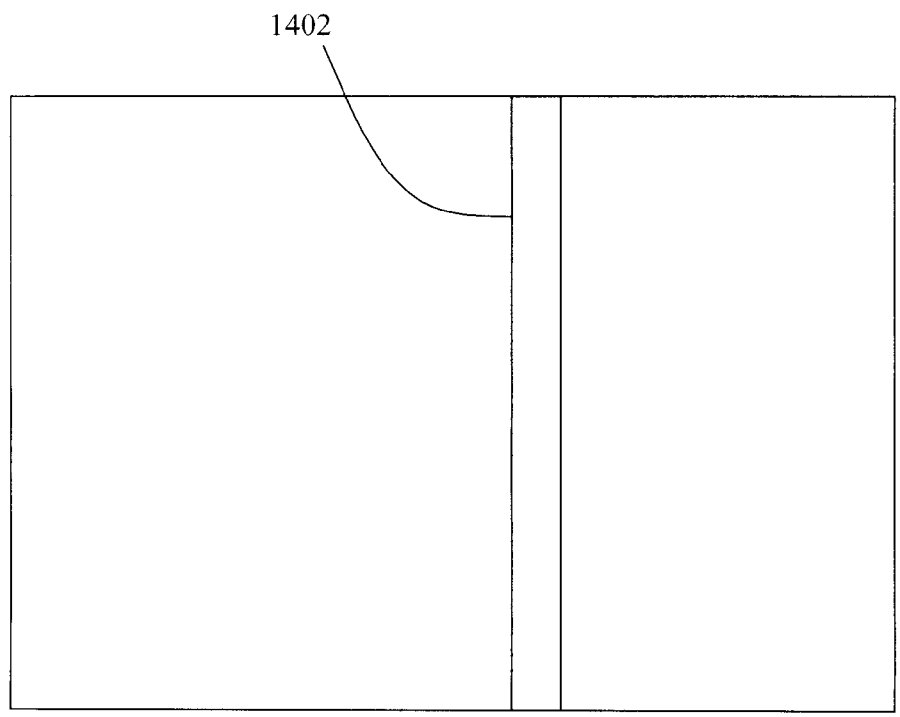
FIGS. 16a-j show an illustrated example of a process for space tile based pushing according to an embodiment of the invention.
Figure 16B:
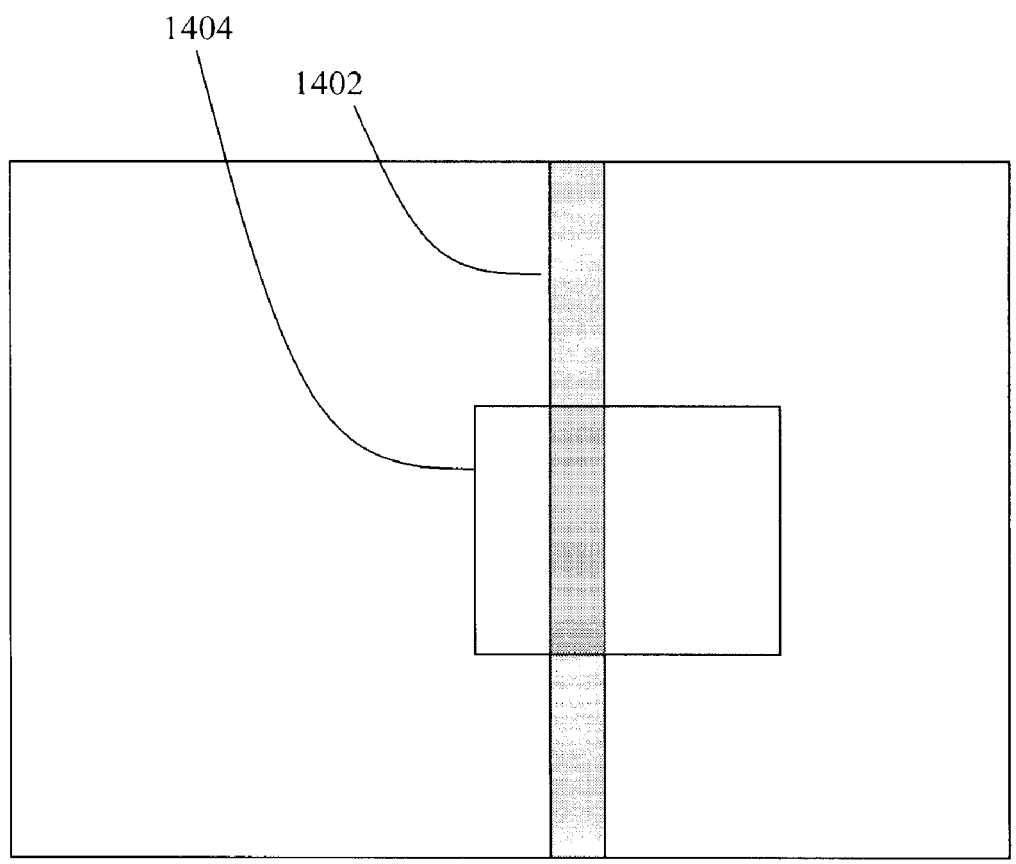
Figure 16C:
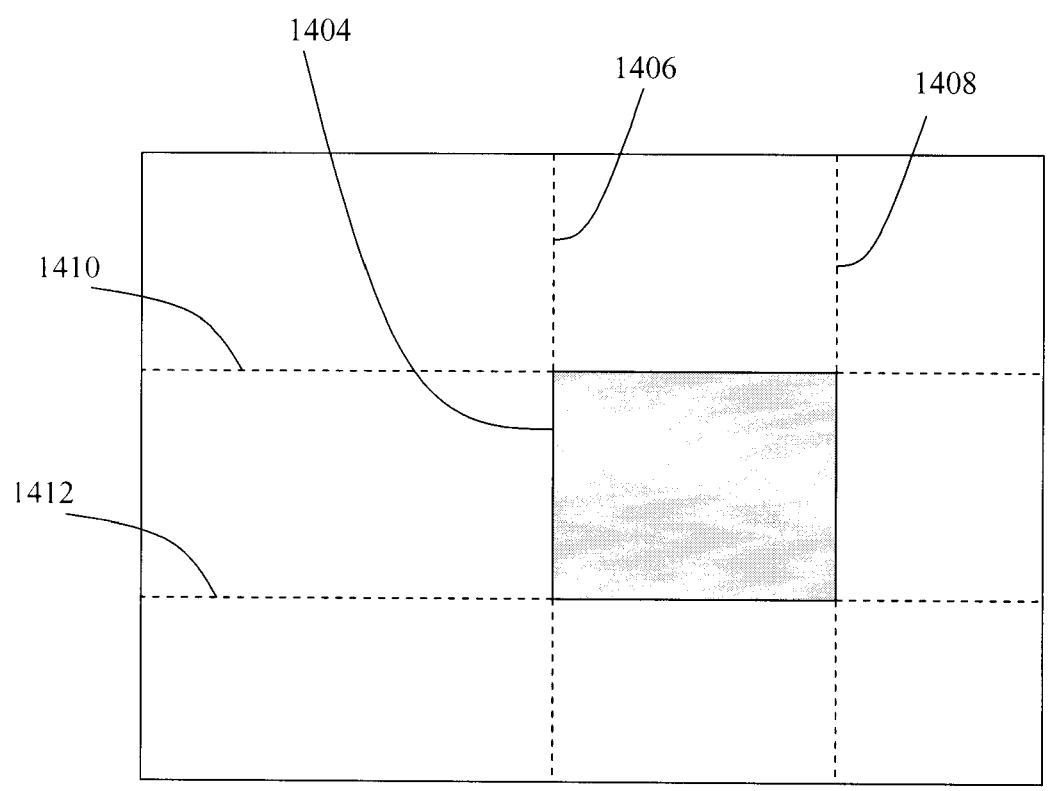

FIGS. 16a-j provide an illustrative example of the process for implementing a space tile based push operation. FIG. 16a shows a window containing a single wire segment 1402. Referring to FIG. 16b, consider if it is desired to place object 1404 as shown, directly in the path of wire 1402. Consistent with the present embodiment of the invention, the first action is to perform a space tile punch to determine the free space tiles relative to wire 1402. When making the free space tile determination, wire 1402 is removed from the window, and therefore the punch is performed relative to the contour and edges of object 1404. Referring to FIG. 16c, boundary lines are drawn extending from each edge of object 1404. Thus, horizontal boundary line 1410 extends from the top edge of object 1404 to the right and left sides of the window. Horizontal boundary line 1412 extends from the bottom edge of object 1404 to the right and left sides of the window. Vertical boundary lines 1406 and 1408 extend from the left and right edges, respectively, of object 1404 to the top and bottom sides of the window.

Figure 16D:
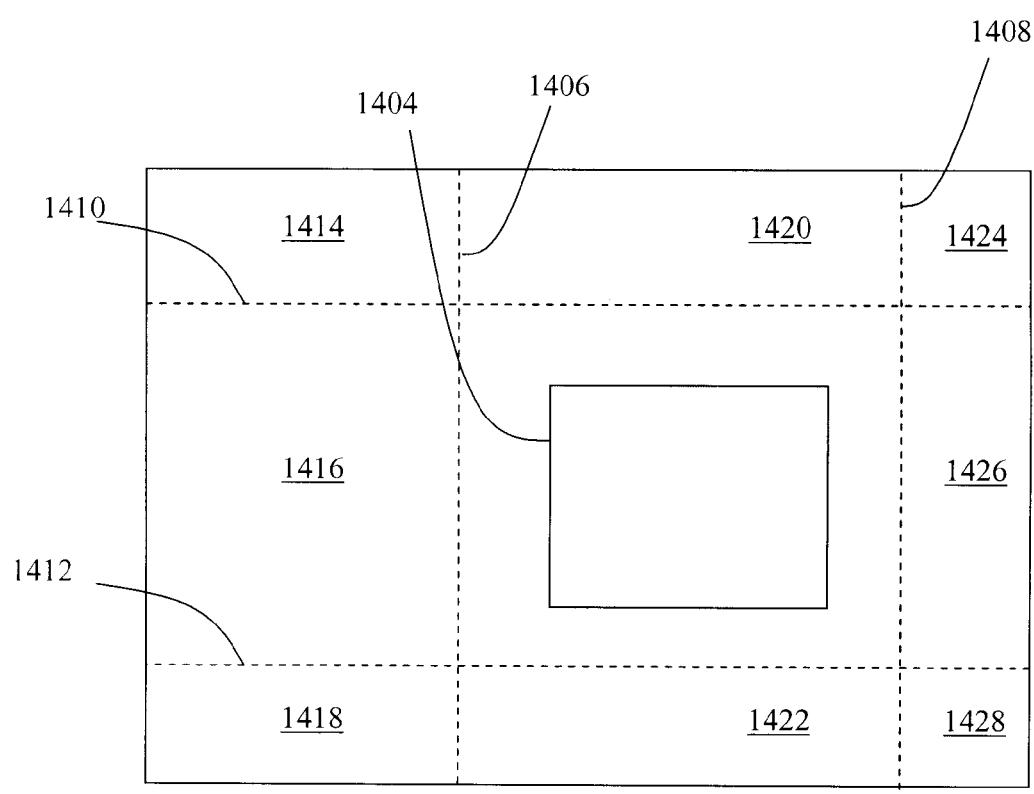

As shown in FIG. 16d, these boundary lines are shifted by a clearance distance plus one half of the width of the wire 1402 to identify the outer boundaries of the movable and permissible locations for the centerline of wire 1402. In effect, a fence is built around object 1404 to prevent any design rule violations or conflicts between the moved location of wire 1402 and object 1404. As stated above, the free space tiles can be identified only with regard for the pushed object 1404, and without immediate consideration for other objects that may exist in the window, e.g., because these other objects can also be moved if moving wire 1402 causes a conflict with these other objects. If the other objects cannot be moved, then they are obstructions that should be considered when forming the free space tiles.

At the completion of the punch process, space tiles 1414, 1416, 1418, 1420, 1422, 1424, 1426, and 1428 are identified which are bounded by boundary lines 1406, 1408, 1410, 1412, and the sides of the window (which indicates that the centerline of wire 1402 can also be moved to the sides of the windows and therefore will not cause a conflict with nearby objects in other windows).

Figure 16E:
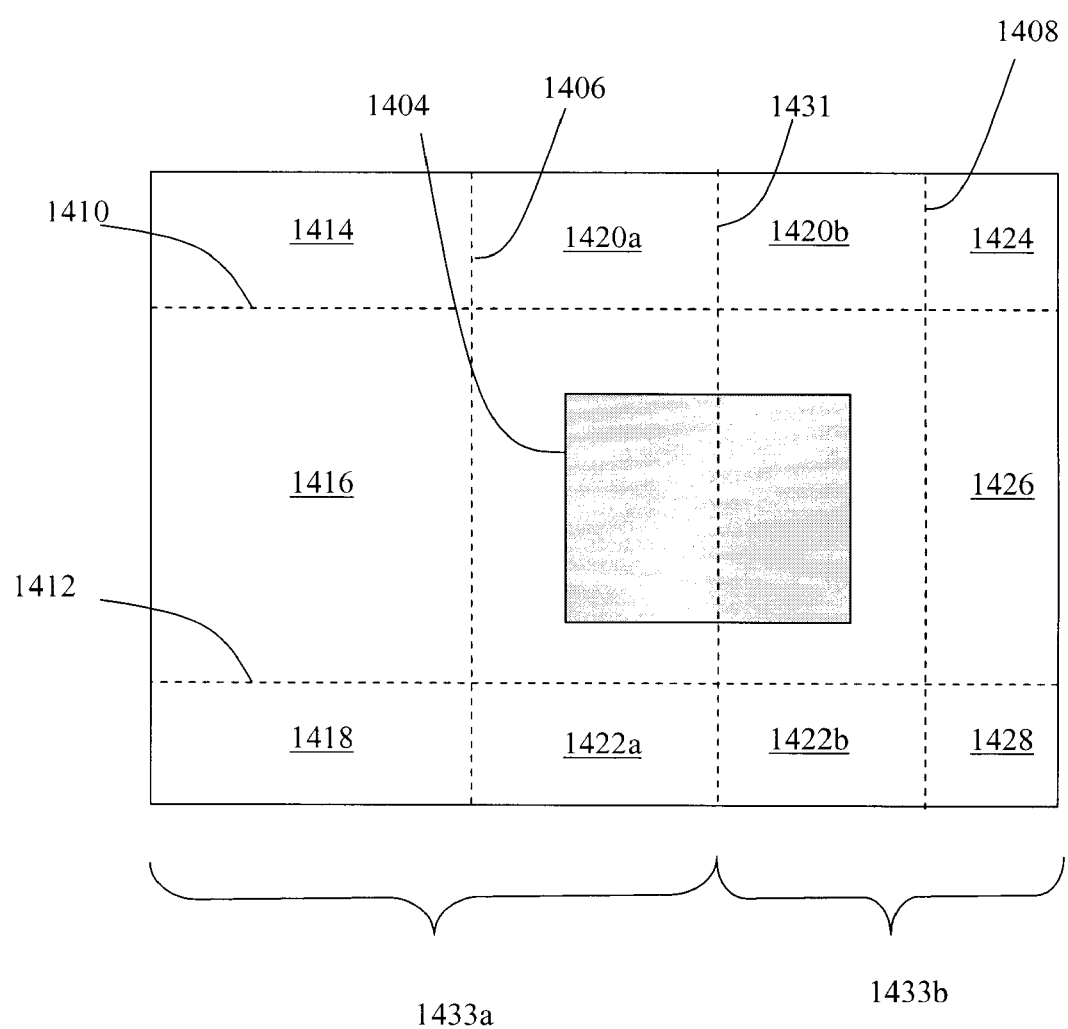

A determination can be made of possible path locations for moving the wire 1402. Referring to FIG. 16e, one approach for identifying possible path locations is to divide the window, e.g., by extending a line 1431 along the preferred routing direction along the center of the object 1404. Other dividing lines/locations can also be used. This line 1431 creates an enclosing window 1433a and an enclosing window 1433b. Free space tile 1420 is split into two free space tiles 1420a and 1420b, with free space tile 1420a residing in enclosing window 1433a and free space tile 1420b residing in enclosing window 1433b. Similarly, free space tile 1422 is split into two free space tiles 1422a and 1422b, with free space tile 1422a residing in enclosing window 1433a and free space tile 1422b residing in enclosing window 1433b.

Figures 1, 16F:
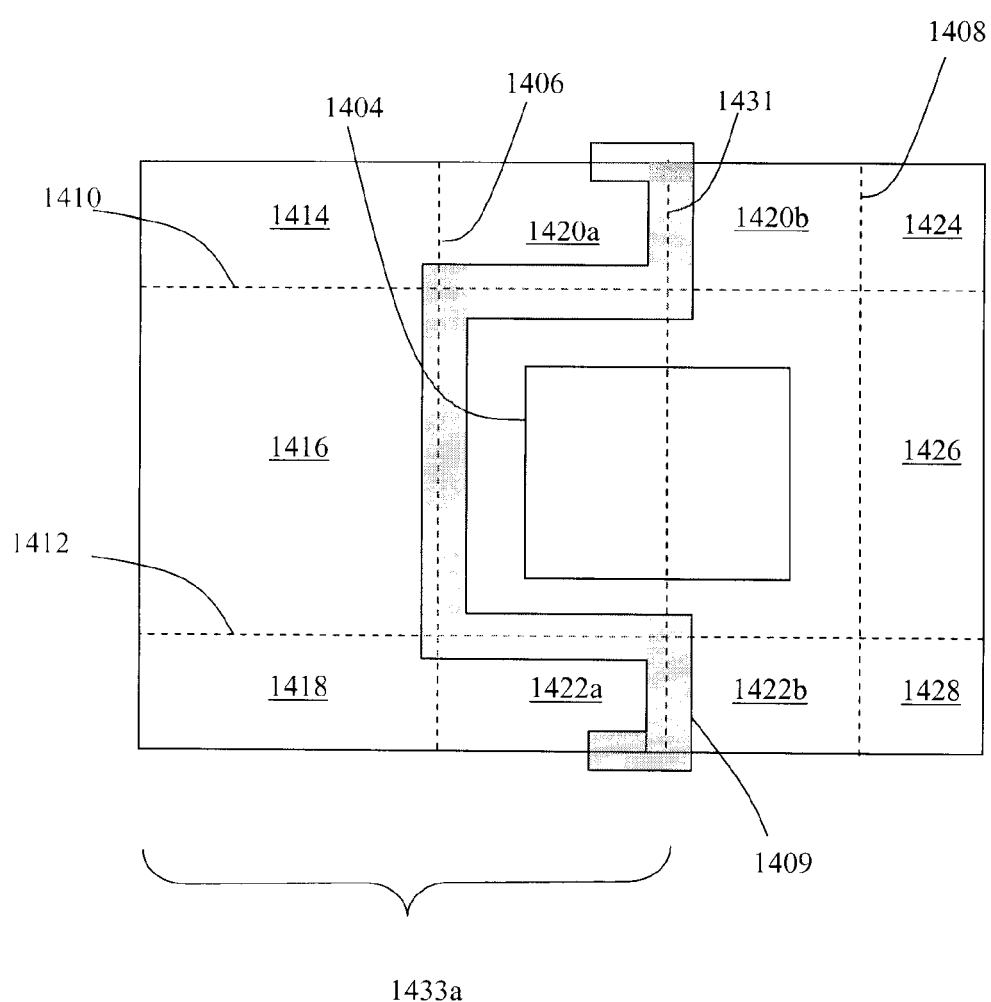
Figures 2, 16F:
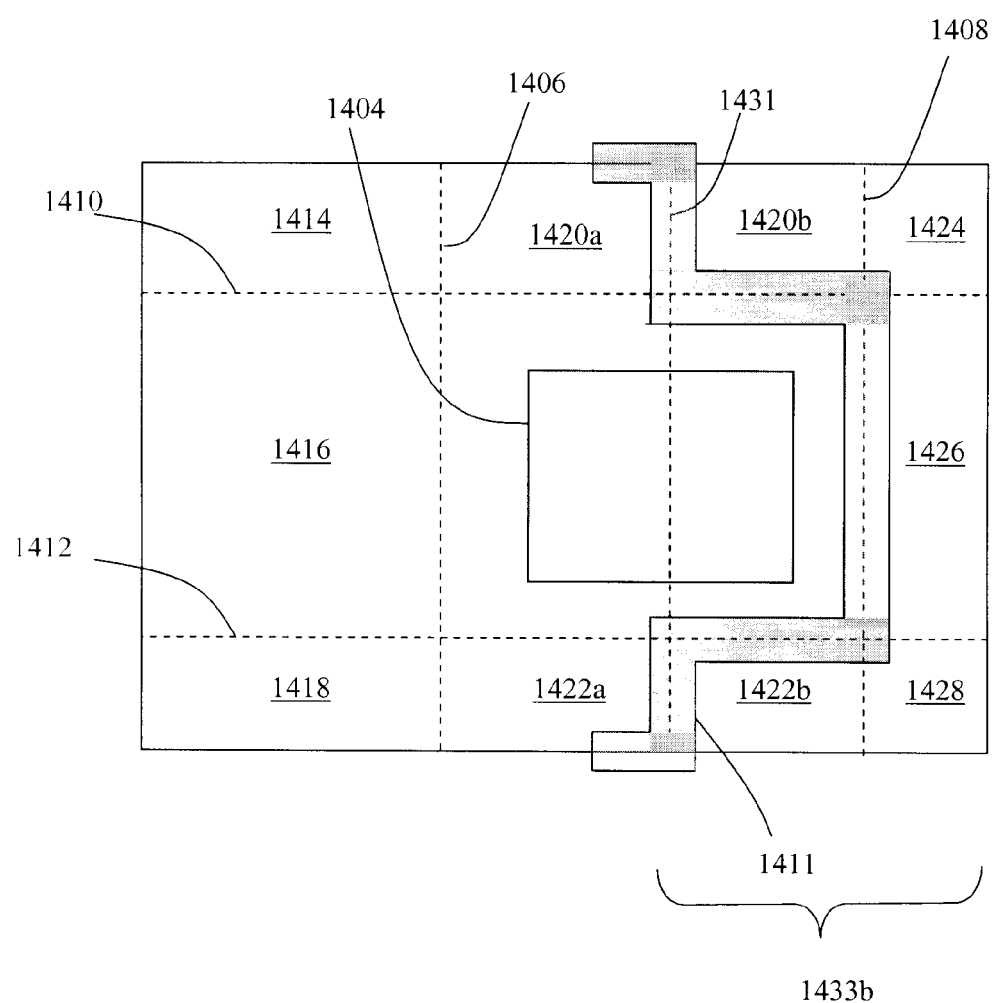

The space tiles are used to identify a possible path for the wire 1402 in each enclosing window. In one embodiment, the identified path is packed as close as possible to object 1404. As noted above, the borders of the free space tiles identify the centerline of available locations to move the wire being punched. Thus, packing a wire or object in a desired direction is performed by identifying the borders of free space tiles as far as possible in the directed packing direction. Here, if it is desired to have wire 1403 maintain as much as possible its original topology, then in one embodiment, the desired packing direction is in the direction of the object 1404. FIG. 16f-1 shows a possible path 1409 in enclosing window 1433a when packing is performed in the direction of object 1404, where the path extends along the borders of free space tiles 1420a, 1416, and 1422a that are closest to object 1404. FIGS. 16f-2 shows a possible path 1411 in sub-window 1433b when packing is performed in the direction of object 1404, where the path extends along the borders of free space tiles 1420b, 1426, and 1422b that are closest to object 1404.

The next action is to determine the path portions for the new path for wire 1402. One method for identifying each path segment of the new path is by identifying each portion which extends to/from an intersection between legal portions of the original path and portions of the possible paths identified using the free space tiles. If the original path segment is free of conflict or rule violation, then the original path segment is retained, since this allows the new path to retain as much as possible of the original wire topology. On the other hand, if the original path segment is not usable, then an alternate path segment is selected using the free space tiles. In many cases, the alternate path segment that is most similar to the original wire topology is the path segment corresponding to the free space tile boundary line that is as close as possible to the original path or the free space tile boundary line closest to the object 1404 that has been inserted into the window.

An identification is made of the sub-window that contains the original path of the wire 1402 to be rerouted. Here, sub-window 1433a contains the original path of the wire 1402. If desired, the dividing line 1431 can be positioned to ensure that the original path of wire 1402 is contained within a single sub-window.

Figure 16G:
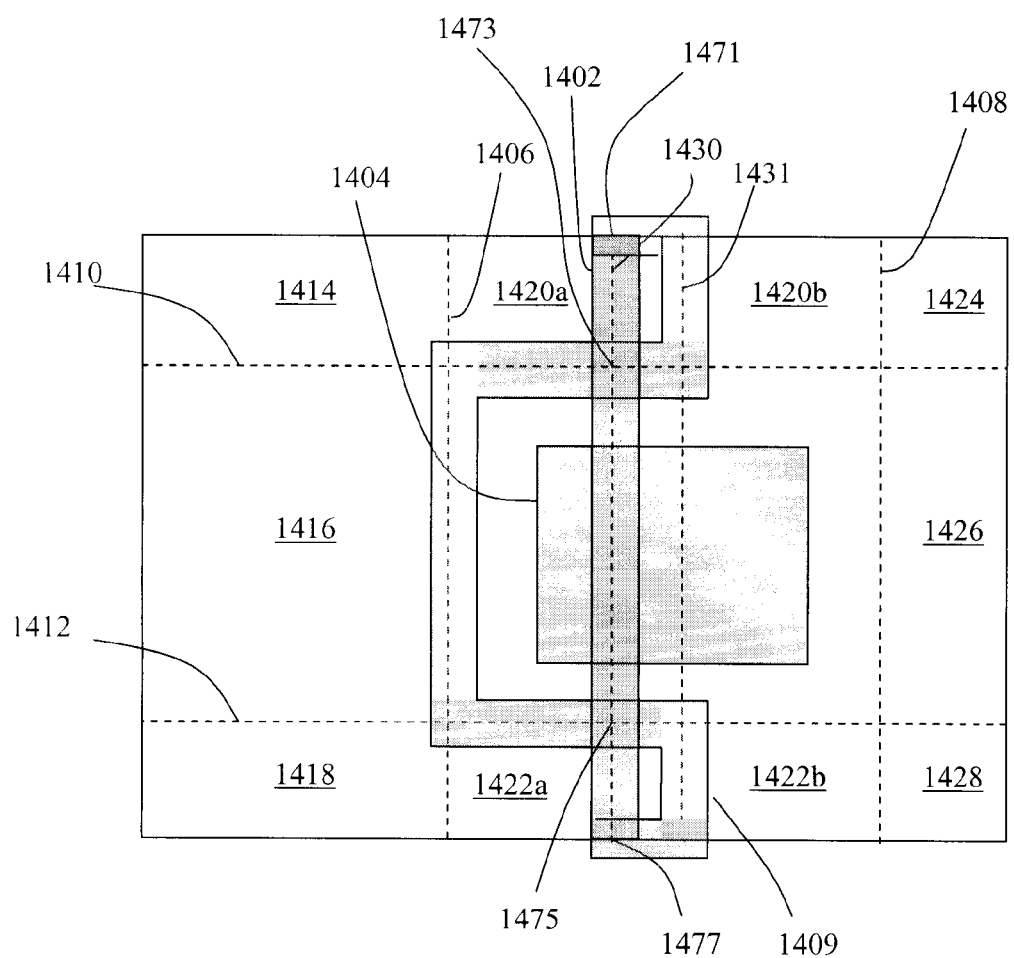
Figure 16H:
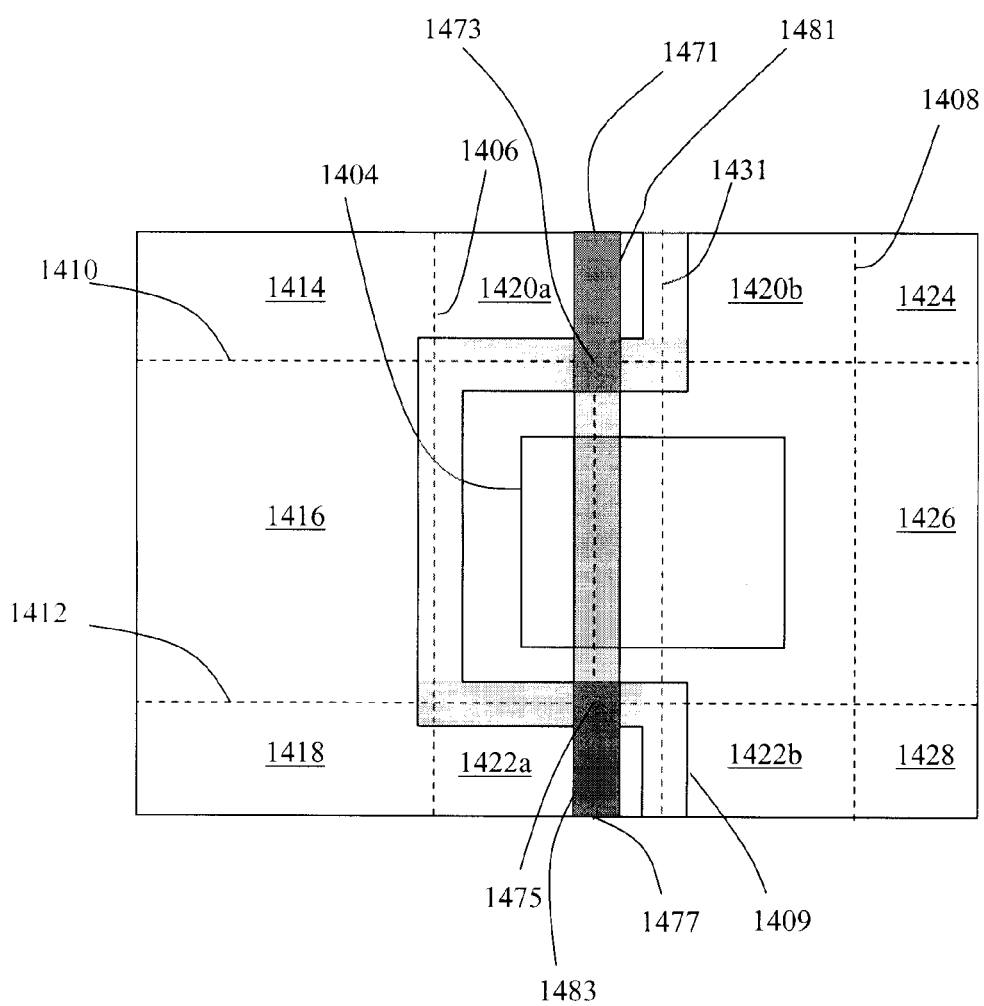

FIG. 16g shows the centerline of the original path 1430 for wire 1402 that has been overlaid over the path 1409 for enclosing window 1433a identified in FIGS. 16f-1. The next step is to identify the path segments for the new path that will be used to reroute wire 1402 around object 1404. The goal of the present embodiment is to identify a new path that is as close as possible to the original topology of the original path 1430 for wire 1402, while avoiding conflicts or design rule violations.

The process continues by identifying portions of the original path for wire 1402 which are legal locations that do not create conflicts. Here, it can be seen that the portion of wire 1402 extending from point 1471 to point 1473 is in a legal location and does not conflict with object 1404. As shown in FIG. 14h, this defines a path portion 1481. The portion of wire 1402 extending from point 1477 to point 1475 also defines a legal location that does not conflict with object 1404. These points define a path portion 1483. Since these path portions 1481 and 1483 do not create a conflict or design rule violation with object 1404, then these path portions can be kept as part of the final path for wire 1402 to maintain as much as possible the original topology for wire 1402.

It can be seen that the portion of the original wire 1402 extending from point 1473 to point 1475 in conflict with object 1404. Therefore, it is this portion of the original wire that is rerouted to form the final path for wire 1402.

Figure 16I:
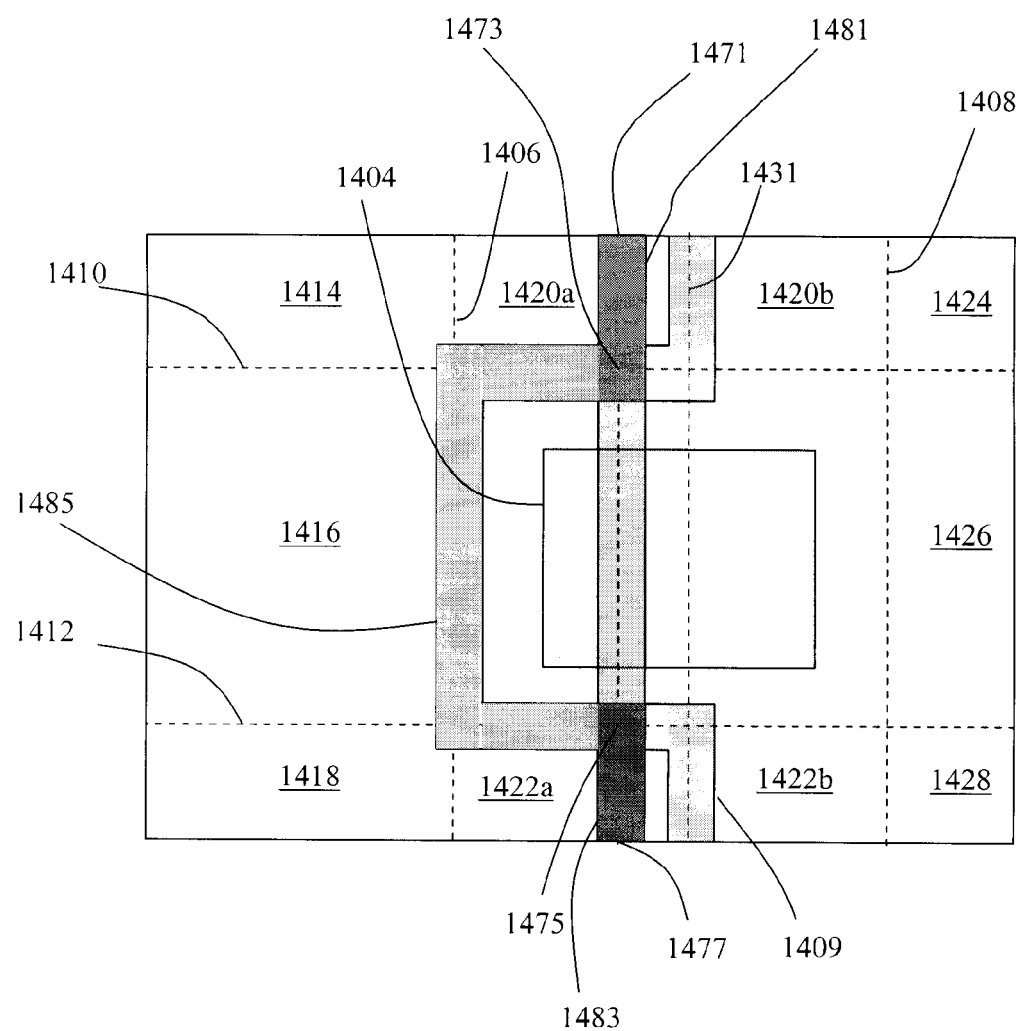

The intersection that occur at points 1473 and 1477 between the original path of wire 1402 and path 1409 formed from the free space tiles define the new path portions for wire 1402. As shown in FIG. 16i, intersection points 1473 and 1475 define a path portion 1485 from path 1409. The combination of path portion 1485 with the legal path portions 1481 and 1483 define the new path for wire 1402.

Figure 16J:
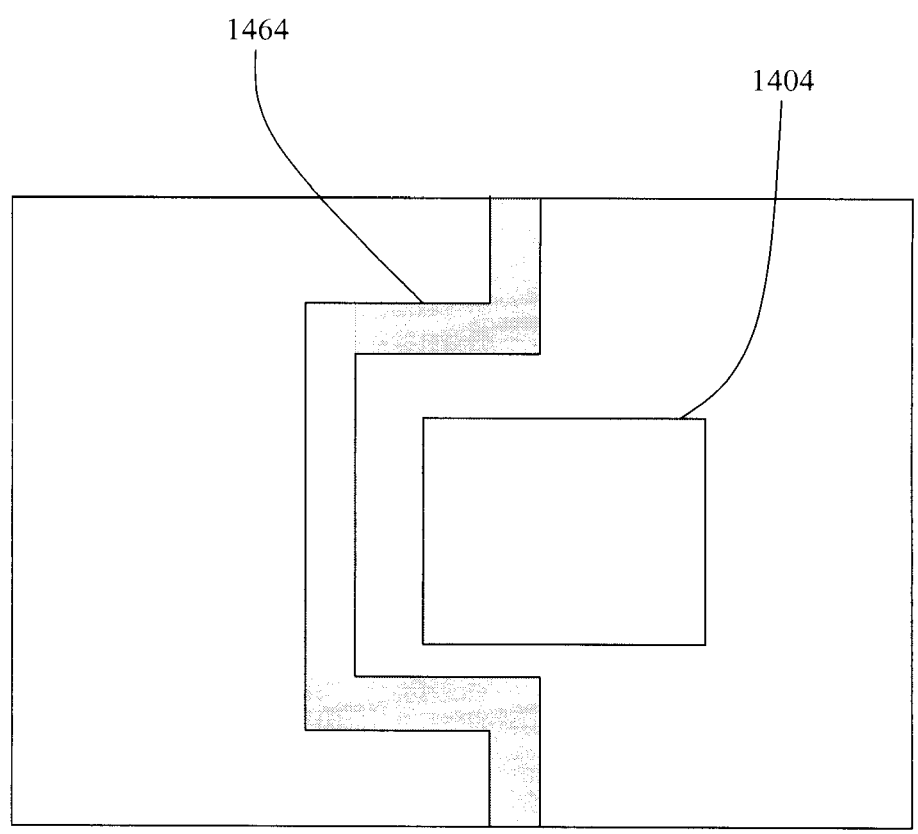

As shown in FIG. 16j, the new wire path for wire 1402 has been completely rerouted. The new path 1464 retains as much as possible the original topology of the original path for wire 1402, but also avoids conflicts and rule violations with respect to object 1404. This process can be repeated for enclosing window 1433b to determine if the alternate path 1411 provides a more advantageous new path for wire 1402. In one embodiment, heuristics can be applied to determine which enclosing window should be processed, or processed first. For example, some factors that can be considered include which enclosing window contains the original routing path, which enclosing window will result in less movements of objects, and the number of obstructions in each enclosing window. If there are any additional objects to reroute, e.g., because either new path 1464 or object 1404 conflicts with other wire segments, then the process repeats to reroute these other objects.

Therefore, what has been described is a method and mechanism for space tile based routing and movement of objects. The present invention may be embodied as any combination of software, hardware, or manual operations. In one specific embodiment, the invention is embodied as a EDA software tool for placing and/or routing integrated circuit designs.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the exact ordering or content of the described process actions may be changed without affecting the scope or operation of the invention. The specification and drawings are, accordingly, to be regarded in an illustrative rather than restrictive sense.

What is claimed is:

1. A computer-implemented method for space tile based packing of objects on an integrated circuit layout, comprising:
   identifying an object to be moved;
   determining one or more free space tiles relative to the object, wherein the one or more space tiles are derived from shapes of objects in an area of the integrated circuit layout;
   determining, by using a processor, if space is available for movement of the object in a desired packing direction corresponding to the one or more free space tiles; and
   if the space is available in the directed packing direction, moving the object to the available space corresponding to the one or more free space tiles.

2. The method of claim 1 in which the one or more free space tiles are based upon the edges of existing shapes in a region of interest on the integrated circuit layout.

3. The method of claim 1 in which boundaries of the one or more free space tiles are configured based upon minimum distance requirements to nearby objects.

4. The method of claim 1 in which the object can jump over another object to be moved in the desired packing direction.

5. The method of claim 1 in which the object is moved such that it follows boundaries of the one or more free space tiles furthest in the desired packing direction.

6. The method of claim 1 in which the object is moved in a second packing direction if the space is not available in the desired packing direction.

7. The method of claim 1 in which the object is a wire.

8. The method of claim 1 in which the object is identified from a group of objects in an ordering scheme based upon which one from the group of objects is closest in the desired packing direction.

9. The method of claim 1 in which boundaries of the one or more free space tiles are configured to identify the centerline for eligible locations of movement for the object.

10. A computer-implemented method for tessellation based packing of objects on an integrated circuit layout, comprising:
    identifying an object to be moved;
    tessellating at least a portion of the integrated circuit layout;
    forming one or more plane figures in the tessellation having edges compliant with a spacing rule, wherein the one or more plane figures are derived from shapes of objects in an area of the integrated circuit layout and the edges of at least one of the one or more plane figures form a contour relating to a shape of the object;
    determining by using a processor if space is available for movement of the object in a desired packing direction corresponding to the plane figures; and
    if the space is available in the directed packing direction, moving the object to the available space.

11. The method of claim 10 in which the edges are configured based upon minimum distance requirements to nearby objects.

12. The method of claim 10 in which the object can jump over another object to be moved in the desired packing direction.

13. The method of claim 10 in which the object is moved such that it follows one or more of the edges furthest in the desired packing direction.

14. The method of claim 10 in which the object is moved in a second packing direction if the space is not available in the desired packing direction.

15. The method of claim 10 in which the object is a wire.

16. The method of claim 10 in which the edges identify the centerline for eligible locations of movement for the object.

17. The method of claim 10 in which the spacing rule specifies a clearance distance added to one-half a wire width for a contemplated object to be moved.

18. A computer program product comprising a computer usable medium having executable code to execute a process for tessellation based packing of objects on an integrated circuit layout, the process comprising:
   (a) identifying an object to be moved;
   (b) tessellating at least a portion of the integrated circuit layout;
   (c) forming one or more plane figures in the tessellation having edges compliant with a spacing rule, the one or more plane figures deriving from shapes of objects in an area of the integrated circuit layout and the edges of at least one of the one or more plane figures forming a contour relating to a shape of the object;
   (d) determining if space is available for movement of the object in a desired packing direction corresponding to the plane figures; and
   (e) if the space is available in the directed packing direction, moving the object to the available space.

19. The computer program product of claim 18 in which the edges are configured based upon minimum distance requirements to nearby objects.

20. The computer program product of claim 18 in which the object can jump over another object to be moved in the desired packing direction.

21. The computer program product of claim 18 in which the object is moved such that it follows one or more of the edges furthest in the desired packing direction.

22. The computer program product of claim 18 in which the object is moved in a second packing direction if the space is not available in the desired packing direction.

23. The computer program product of claim 18 in which the object is a wire.

24. The computer program product of claim 18 in which the edges identify the centerline for eligible locations of movement for the object.

25. The computer program product of claim 18 in which the spacing rule specifies a clearance distance added to one-half a wire width for a contemplated object to be moved.

26. A computer program product comprising a computer usable medium having executable code to execute a process for space tile based packing of objects on an integrated circuit layout, the process comprising:
   (a) identifying an object to be moved;
   (b) determining one or more free space tiles relative to the object, wherein the one or more space tiles are derived from the shapes of objects in an area of the integrated circuit layout;
   (c) determining if space is available for movement of the object in a desired packing direction corresponding to the one or more free space tiles; and
   (d) if the space is available in the directed packing direction, moving the object to the available space corresponding to the one or more free space tiles.

27. The computer program product of claim 26 in which the one or more free space tiles are based upon the edges of existing shapes in a region of interest on the integrated circuit layout.

28. The computer program product of claim 26 in which boundaries of the one or more free space tiles are configured based upon minimum distance requirements to nearby objects.

29. The computer program product of claim 26 in which the object can jump over another object to be moved in the desired packing direction.

30. The computer program product of claim 26 in which the object is moved such that it follows boundaries of the one or more free space tiles furthest in the desired packing direction.

31. The computer program product of claim 26 in which the object is moved in a second packing direction if the space is not available in the desired packing direction.

32. The computer program product of claim 26 in which the object is a wire.

33. The computer program product of claim 26 in which the object is identified from a group of objects in an ordering scheme based upon which one from the group of objects is closest in the desired packing direction.

34. The computer program product of claim 26 in which boundaries of the one or more free space tiles are configured to identify the centerline for eligible locations of movement for the object.

35. A system for tessellation based packing of objects on an integrated circuit layout, comprising:
   (a) means for identifying an object to be moved;
   (b) means for determining one or more free space tiles relative to the object, wherein the one or more space tiles are derived from the shapes of objects in an area of the integrated circuit layout;
   (c) means for determining if space is available for movement of the object in a desired packing direction corresponding to the one or more free space tiles; and
   (d) means for moving the object to the available space corresponding to the one or more free space tiles if the space is available in the directed packing direction.

36. The system of claim 35 in which the one or more free space tiles are based upon the edges of existing shapes in a region of interest on the integrated circuit layout.

37. The system of claim 35 in which boundaries of the one or more free space tiles are configured based upon minimum distance requirements to nearby objects.

38. The system of claim 35 in which the object can jump over another object to be moved in the desired packing direction.

39. The system of claim 35 in which the object is moved such that it follows boundaries of the one or more free space tiles furthest in the desired packing direction.

40. The system of claim 35 in which the object is moved in a second packing direction if the space is not available in the desired packing direction.

41. The system of claim 35 in which the object is identified from a group of objects in an ordering scheme based upon which one from the group of objects is closest in the desired packing direction.

42. The system of claim 35 in which boundaries of the one or more free space tiles are configured to identify the centerline for eligible locations of movement for the object.

43. A system for tessellation based packing of objects on an integrated circuit layout, comprising:
   (a) means for identifying an object to be moved;
   (b) means for tessellating at least a portion of the integrated circuit layout;
   (c) means for forming one or more plane figures in the tessellation having edges compliant with a spacing rule, wherein the one or more plane figures are derived from shapes of objects in an area of the integrated circuit layout and the edges of at least one of the one or more plane figures form a contour relating to a shape of the object;

(d) means for determining if space is available for movement of the object in a desired packing direction corresponding to the plane figures; and (e) means for moving the object to the available space if the space is available in the directed packing direction.

44. The system of claim 43 in which the edges are configured based upon minimum distance requirements to nearby objects.

45. The system of claim 43 in which the object can jump over another object to be moved in the desired packing direction.

46. The system of claim 43 in which the object is moved such that it follows one or more of the edges furthest in the desired packing direction.

47. The system of claim 43 in which the object is moved in a second packing direction if the space is not available in the desired packing direction.

48. The system of claim 43 in which the edges identify the centerline for eligible locations of movement for the object.

49. The system of claim 43 in which the spacing rule specifies a clearance distance added to one-half a wire width for a contemplated object to be moved.

* * * * *